United States Patent
Zhang et al.

(10) Patent No.: US 9,087,174 B1
(45) Date of Patent: Jul. 21, 2015

(54) METHODS, SYSTEMS, AND ARTICLES OF MANUFACTURE FOR IMPLEMENTING MULTIPLE-PATTERNING-AWARE DESIGN RULE CHECK FOR ELECTRONIC DESIGNS

(71) Applicant: Cadence Design Systems, Inc., San Jose, CA (US)

(72) Inventors: Shuo Zhang, Fremont, CA (US); Vassilios Gerousis, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/840,567

(22) Filed: Mar. 15, 2013

(51) Int. Cl.
*G06F 17/50* (2006.01)

(52) U.S. Cl.
CPC ................. *G06F 17/5081* (2013.01)

(58) Field of Classification Search
CPC ............................................... G06F 17/5081
USPC ................................................... 716/100, 52
See application file for complete search history.

(56) References Cited

U.S. PATENT DOCUMENTS

| | | | |
|---|---|---|---|
| 5,757,089 A | 5/1998 | Ishizuka | |
| 5,808,899 A | 9/1998 | Scepanovic et al. | |
| 5,837,557 A * | 11/1998 | Fulford et al. | 438/6 |
| 5,923,562 A * | 7/1999 | Liebmann et al. | 716/52 |
| 6,292,929 B2 | 9/2001 | Scepanovic et al. | |
| 7,197,738 B1 | 3/2007 | Hetzel et al. | |
| 7,280,945 B1 * | 10/2007 | Weiner et al. | 703/2 |
| 7,424,695 B2 | 9/2008 | Tamura et al. | |
| 7,691,549 B1 * | 4/2010 | Glasser | 430/22 |
| 7,721,243 B2 | 5/2010 | Hetzel et al. | |
| 8,341,586 B2 | 12/2012 | Frankle et al. | |
| 8,863,048 B1 * | 10/2014 | Gerousis et al. | 716/55 |
| 2001/0003843 A1 | 6/2001 | Scepanovic et al. | |
| 2003/0121018 A1 | 6/2003 | Leung et al. | |
| 2004/0143797 A1 | 7/2004 | Nguyen et al. | |
| 2007/0230770 A1 * | 10/2007 | Kulkarni et al. | 382/149 |
| 2009/0204930 A1 | 8/2009 | Cohn et al. | |
| 2009/0254875 A1 | 10/2009 | Mehrotra et al. | |
| 2010/0187658 A1 * | 7/2010 | Wei | 257/618 |
| 2012/0131528 A1 | 5/2012 | Chen et al. | |
| 2013/0168827 A1 | 7/2013 | Kodama et al. | |
| 2013/0346937 A1 | 12/2013 | Kennedy et al. | |
| 2014/0038085 A1 | 2/2014 | Chern et al. | |
| 2014/0115546 A1 | 4/2014 | Wang et al. | |

OTHER PUBLICATIONS

Notice of Allowance dated May 30, 2014 for U.S. Appl. No. 13/840,259.

(Continued)

*Primary Examiner* — Suchin Parihar
(74) *Attorney, Agent, or Firm* — Vista IP Law Group, LLP

(57) ABSTRACT

Disclosed are methods, systems, and articles of manufactures for implementing multiple-patterning-aware design rule check for an electronic design. Various embodiments identify one or more sets of multiple-exposure grids and identify or generate a data structure by using the one or more sets of grids to store design data of shape ends of various ends. Various embodiments perform constant time design rule checking by performing a constant time search process on the data structure to look up from the data structure one or more violations of one or more design rules which include at least one directional design rule. Some aspects are directed at fixing a design rule violation by using at least some grids of the one or more sets of grids.

32 Claims, 21 Drawing Sheets

(56) References Cited

OTHER PUBLICATIONS

Ex-Parte Quayle Action dated Mar. 12, 2014 for U.S. Appl. No. 13/840,259.

Non-Final Office Action dated Feb. 28, 2014 in U.S. Appl. No. 13/840,717, filed Mar. 15, 2013, inventor: Vassilios Gerousis, (19pages).

Final Office Action dated Feb. 10, 2015 for U.S. Appl. No. 13/840,717.

* cited by examiner

LEGENDS:
———— 902A
- - - - - - 904A
- - - - - - - 906A

ME THODS, SYSTEMS, AND ARTICLES OF
MANUFACTURE FOR IMPLEMENTING
MULTIPLE-PATTERNING-AWARE DESIGN
RULE CHECK FOR ELECTRONIC DESIGNS

CROSS REFERENCE TO RELATED
APPLICATION(S)

This application is related to U.S. patent application Ser. No. 13/840,259 entitled "METHODS, SYSTEMS, AND ARTICLES OF MANUFACTURE FOR IMPLEMENTING CORRECT-BY-CONSTRUCTION PHYSICAL DESIGNS WITH MULTIPLE-PATTERNING-AWARENESS", and U.S. patent application Ser. No. 13/840,717 entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN", the content of both applications is hereby incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Gridded physical implementation of electronic design has been widely used. Nonetheless, the traditional gridded physical implementation is not correct-by-construction and fails to accommodate the trim mask rules. In addition, conventional physical design approaches are usually dependent upon the total number of shapes in a physical design. In other words, the larger the electronic design is, the longer it takes these conventional physical design tools to perform their respective functions. Regarding multiple-patterning to achieve half-pitch sizes in modern electronics (e.g., designs with 14 nm or 10 nm technology nodes), some previous solutions utilize multiple core masks; and some other previous solutions utilize self-aligned double patterning techniques. Both approaches have their own respective disadvantages and do not accommodate the trim mask rules. For design rule checking, conventional DRC (design rule checking) examines the shapes or geometries of a physical design, and the search time for each search of the conventional DRC is to be of an order (log(n)) or even an order(n) depending on the design database used for the DRC process, where n denotes the total number of shapes in the entire design.

SUMMARY

Disclosed are methods, systems, and articles of manufactures for implementing multiple-patterning-aware design rule check for electronic designs. Some embodiments of the invention first define or identify one or more sets of grids for a metal layer and then uses the flexible coloring routing engine to determine a routing solution with the layout design rules and the trim mask rules. Some embodiments instruct the flexible color routing engine to extend a line end of the interconnect to an appropriate grid in the one or more sets of grids.

In some embodiments, the one or more sets of grids may be deemed as some routing tracks that are not used to route interconnects on the layer on which an interconnect is extended in some embodiments where only the right-way tracks are used for each routing layer. Rather, these tracks may be the routing tracks for an adjacent layer of the current layer on which interconnects are extended to the corresponding grids. For example, one or more sets of vertical routing grids may be defined or identified on a horizontal routing layer under consideration in some embodiments where a routing layer allows for only the right-way tracks.

Some embodiments also apply similar processes to determine the routing solutions and allows for both the right-way and the wrong-way tracks on the same routing layer by using, for example, extra bit(s) in representing an interconnect in a data structure that is used to store the routing solution at a higher abstraction level. In addition to the one or more sets of, the method may need to define or identify one or more additional sets of grids for extending or contracting the line ends in the direction of wrong-way tracks in some embodiments.

Once the one or more sets of grids are determined or identified, some embodiments may then construct an edge map that provides guidance for various other processes such as a DRC check process. For example, after the one or more sets of grids are determined or identified, some embodiments may then determine an edge map for a portion of the layout based at least in part on the one or more sets of grids. Some embodiments may build the edge map by extracting the line ends of the interconnects from a full geometry layout data and constructing the edge map with the extracted line ends. Some embodiments thus convert a physical design into a grid layout where each interconnect is represented by a set of absolute, relative, or symbolic coordinates.

For example, an interconnect may be represented by the coordinates of the first line end, the coordinates of the other line end, and the through-wire and may thus be stored in a data structure for further uses. In some embodiments, an interconnect may be associated with or represented by a track number and one or more grid numbers. In these embodiments, the physical implementation tools may ignore the line ends that fall on the grids without further checking these line ends against, for example, the trim mask rules or requirements. In other words, the interconnects whose line ends fall at some grids are thus correct by correction. An interconnect may thus be represented and stored at a higher abstraction level in some embodiments.

For example, an interconnect may be represented by the "high-end", the "low-end", and the "through-wire" attributes in a design database, rather than storing the shapes, geometries, etc. as is usually done with traditional design database. In some embodiments where both the right-way tracks and the wrong-way tracks are permitted, the data structure storing the design information at the higher abstraction level may be augmented by having extra bit(s) of low-wire and high-wire in addition to the low-end, high-end, and through-wire data for representing the right-way tracks to represent the wrong-way tracks. In some embodiments, a grid layout may include the one or more sets of grids for routing or DRC checking and the routing grids or tracks. It shall be noted that the one or more sets of grids for routing are not necessarily the same as the one or more sets of grids for DRC purposes. As previously presented, finer grids may provide finer adjustment capability in extending and/or contracting the line ends of an interconnect but may (although not necessarily) result in a larger layout data and thus increase the expense of the DRC process. Finer grids has the same data structure but larger layout data.

Once the edge map is determined or identified, the DRC engine may simply perform the design rule check by using the grid layout instead of the traditional physical design. Due to the simplicity of the data structure of the grid layout, some embodiments may perform the DRC process efficiently by examining data in the simplified representation of grid layout via, for example, a simple table-lookup process to determine whether an interconnect satisfies certain design rules. Some embodiments may further check the SID rule(s) on these line ends in the edge map. In addition, with carefully determined grids, the DRC engine needs not check many design rules.

For example, for well-defined routing grids with the proper spacing or pitch, the routing engine may require that all interconnects must be on track, and thus the DRC engine needs not check the spacing requirements in some embodiments. Some other embodiments may convert geometry-based design rules or requirements (e.g., minimum spacing rules with the minimum spacing values such as 42 nm) into grid-based rules or requirements (e.g., minimum spacing rules with the minimum spacing value of 4 grids) based at least in part upon the one or more sets of grids such that the routing engine may refer to only these grid-based rules or requirements during the routing process without referring to the actual design rules or requirements.

The DRC engine may then perform the DRC process with respect to a portion of the layout based at least in part on this edge map to determine whether or not the grid layout complies with various design rules or requirements in some embodiments. For certain design rules, the DRC process requires a mere table look-up process to determine whether the grid layout complies with such design rules.

Some embodiments are directed at fixing a layout of an electronic design. More particular, the method may identify a violation between two or more interconnects and selects one of the two or more interconnects to initiate a fixing process for the violation. In some embodiments, the method may identify the interconnect that is associated with the most number of violations to initiate the fixing process. In some embodiments, the method may identify the interconnect in the natural order of the two or more interconnects. It shall be noted that initiating the fixing process with the interconnect with the greatest number of violations may not necessarily be the fastest route to achieve a DRC clean design because fixing one violation of an interconnect may cause one or more other violations in the same or in some other part of the design in some embodiments. Alternatively, fixing one violation of an interconnect having multiple violations does not necessarily that the other violations of the same interconnect will also be fixed. On the other hand, fixing a violation of an interconnect with the most number of violations may concurrently fix other violations of the same interconnect in some other embodiments. Therefore, the order of fixing may be determined heuristically in some embodiments.

When the interconnect is identified, some embodiments may fix the violation by extending a line end of the interconnect to a grid and determine whether extending the line end fixes the violation. If it is determined that extending the line end does not fix the violation, the method may further extend the line end to the next grid and repeats the process until the method finds a satisfactory solution. In some embodiments, the method may also contract a line end of an interconnect to fix a violation. As in the DRC process, the violation fixing process has a constant or nearly constant fixing time. In some other embodiments, rather than actually extending a line end to a grid and repetitively determining whether extending the line end to the grid actually fixes the violation, the method may examine one or more grids for a particular line end associated with a violation and determines whether or which candidate grid yields the fewest number of violations or even no violations. This examination of multiple candidate grids is a feasible solution because with the examination may involve only a table look-up with the grid layout presented in the routing application. The method may then identify such a candidate grid and then extends the line end to the candidate grid as a solution to fix the violation. It shall be noted that the aforementioned embodiments mentioned "interconnects". Nonetheless, the same approaches may also apply to pins with full and equal effects.

BRIEF DESCRIPTION OF THE FIGURES

The drawings illustrate the design and utility of various embodiments. It should be noted that the figures are not drawn to scale and that elements of similar structures or functions are represented by like reference numerals throughout the figures. In order to better appreciate how to obtain the above-recited and other advantages and objects of various embodiments, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF ILLUSTRATED EMBODIMENTS

Various embodiments are directed to a method, system, and computer program product for implementing multiple-patterning-aware design rule check for an electronic design. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-10.

Figure 1:
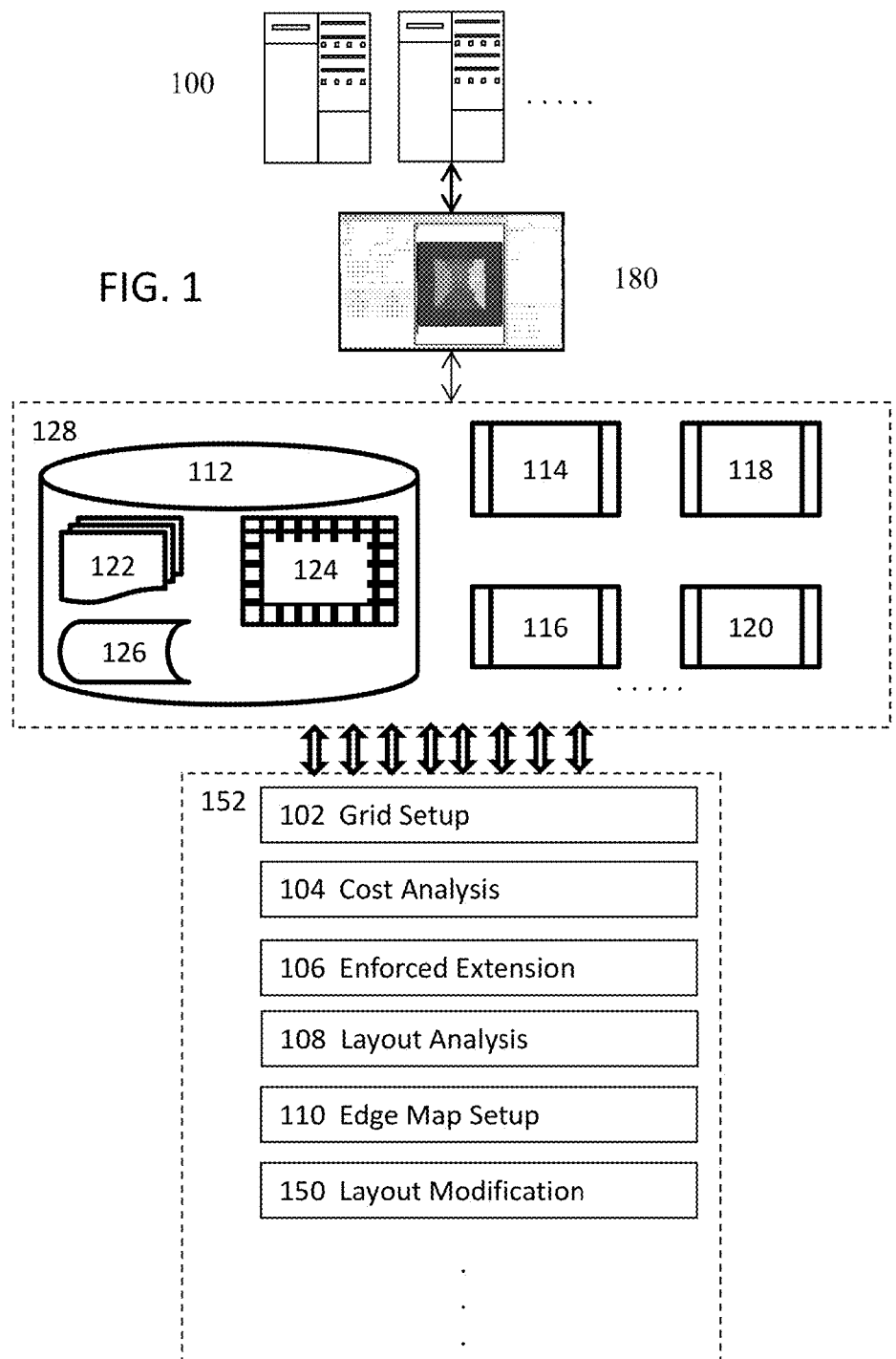
FIG. 1 illustrates a schematic representation of exemplary implementations for implementing multiple-patterning-aware design rule check for an electronic design in some embodiments.

FIG. 1 illustrates a high level block diagram for implementing physical design decomposition with custom connectivity in some embodiments. In one or more embodiments, the system for implementing physical design decomposition with custom connectivity may comprise one or more computing systems 100, such as a general purpose computer described in the System Architecture Overview section to operate on an electronic design 180 in order to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128, invoke various software, hardware modules, or a combination thereof 152 that may comprise a conductivity or connectivity (hereinafter conductivity) inference module 102 to infer conductivity for a physical design or a portion thereof, a force directed placement or floorplanning module 104 to perform the placement or floorplanning functions for the physical design or a portion thereof, a design decomposition or partitioning module 106 to partition an area of a physical design into a plurality of cells, regions, or blocks (hereinafter cells) either alone or jointly with one or more other modules, a force model determination modules 108 to determine various characteristics, parameters, variables, etc. for one or more force models, or a conductivity reconfiguration engine 110 to reconfigure some conductivity for a physical design or a portion thereof, etc.

Figure 2:
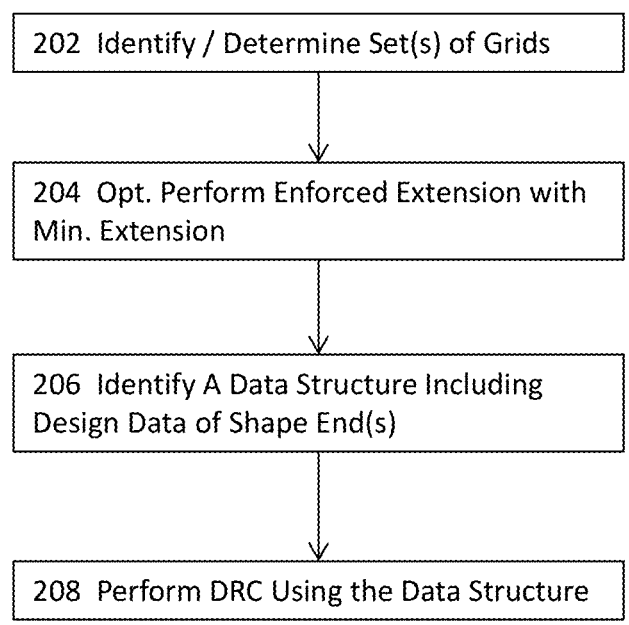
FIG. 2 illustrates a top level flow diagram for implementing multiple-patterning-aware design rule check for an electronic design in some embodiments.

FIG. 2 illustrates a top level flow diagram for implementing multiple-patterning-aware design rule check for an electronic design in some embodiments. In one or more embodiments, the method for implementing multiple-patterning-aware design rule check for an electronic design may comprise the process 202 of identifying or determining one or more sets of MP grids. More details about identifying or determining one or more sets of MP grids are described in U.S. application Ser. No. 13/840,259, entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN", the content of which is hereby incorporated by reference in its entirety for all purposes.

In some embodiments, the method illustrated in FIG. 2 may optionally comprise the process 204 of perform enforced extension. In some of these embodiments, the process 204 may perform the enforced extension with minimum extension. More details about enforced extension will be described in subsequent paragraphs with reference to FIG. 4.

In some embodiments, the method illustrated in FIG. 2 may comprise the process 206 of identifying a data structure including the data about shape ends (e.g., line end) of a shape (e.g., an interconnect) or a portion of a layout. In some embodiments, the data structure comprises an edge map or an edge grid (hereinafter edge map). More details about edge maps are described in U.S. application Ser. No. 13/840,259, entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN" and U.S. application Ser. No. 13/840,717, entitled "METHODS, SYSTEMS, AND ARTICLES OF MANUFACTURE FOR IMPLEMENTING CORRECT-BY-CONSTRUCTION PHYSICAL DESIGNS WITH MULTIPLE-PATTERNING-AWARENESS", the content of both applications is hereby incorporated by reference in its entirety for all purposes.

In some embodiments, the method illustrated in FIG. 2 may comprise the process 208 of performing design rule checking using at least the data structure. In some of these embodiments where an edge map is used for the DRC process 208, the process 208 performs constant time design rule checking that is independent of the total number of design elements (e.g., the total number of interconnects) in the entire design or in a portion thereof. These embodiments may perform a constant time search for one or more shapes that violate a design rule, unlike other conventional approaches that search for shapes within a halo and performs comparison between the identified shapes and the rule and thus require the design rule checking time or a search time in an order (n) with regular design databases or order(log(n)) with a tree structure for the search, where n denotes the total number of shapes in a design. In other words, with the edge map data structure that stores the line ends, various DRC or search processes merely examines the edge map to determine the total number of line ends falling within a search radius or halo. Therefore, the search time and thus the check time are constant regardless of the number of shapes or design elements to be searched or checked. Another advantage of this constant time DRC and constant time search is that various embodiments described herein convert the multiple-exposure physical implementation problem (e.g., DRC or routing), which is global in nature, into a local problem.

Figure 2A:
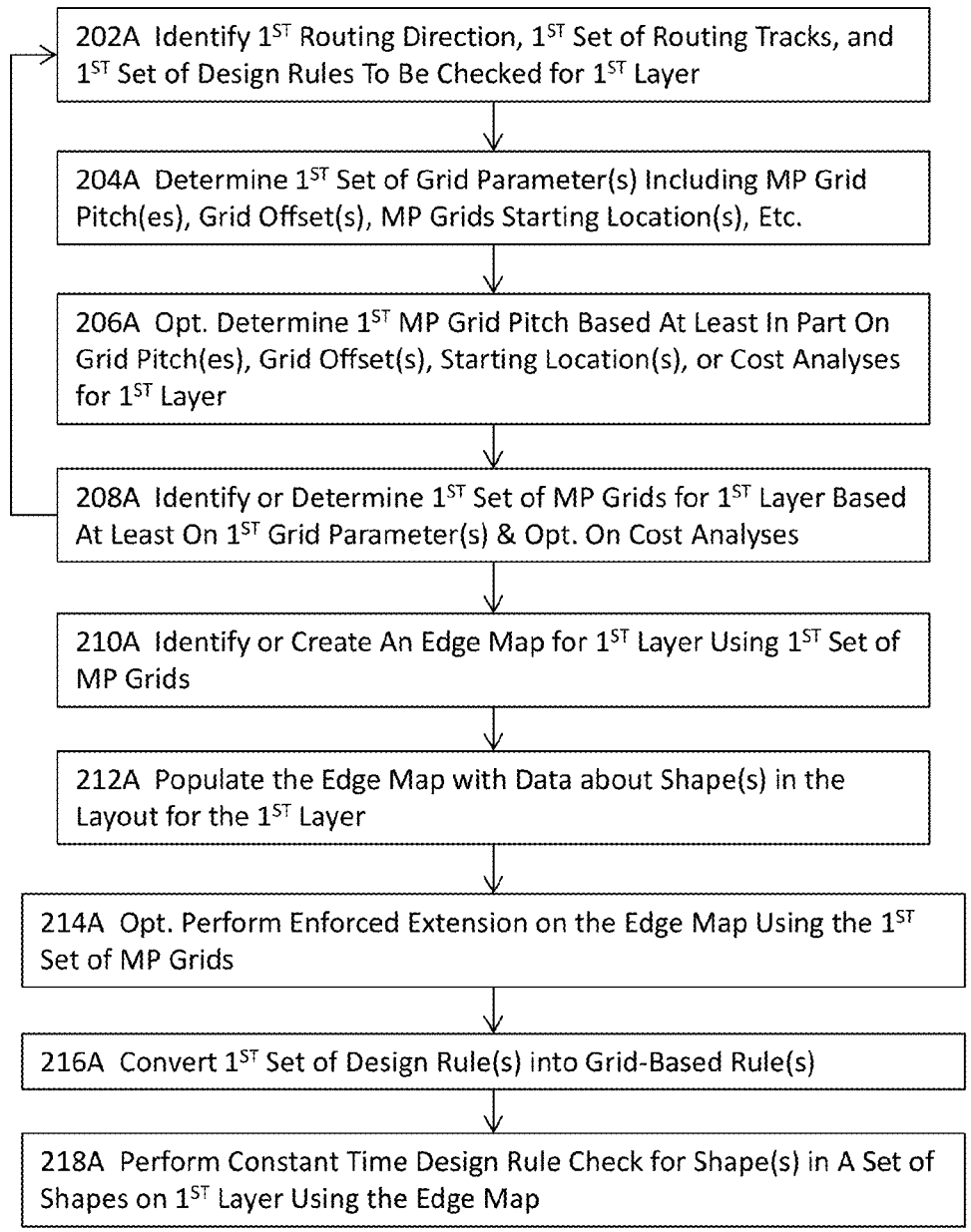
FIG. 2A illustrates a more detailed flow diagram for implementing multiple-patterning-aware design rule check for an electronic design in some embodiments.

FIG. 2A illustrates a more detailed flow diagram for implementing multiple-patterning-aware design rule check for an electronic design in some embodiments. In one or more embodiments, the method illustrated in FIG. 2A may comprise the process 202A of identifying a first routing direction and a first set of routing tracks for a first layer of an electronic design. In some of these embodiments, process 202A may further optionally identify a first set of design rules to be checked for the first layer.

In some embodiments, the method illustrated in FIG. 2A may comprise the process 204A of identifying or determining a first set of grid parameters that may include, for example but not limited to one or more grid pitches, one or more grid offsets, one or more grids starting locations, etc. In some embodiments, the method illustrated in FIG. 2A may optionally comprise the process 206A of determining a first multiple-exposure (MP) grid pitch based at least in part upon the first set of grid parameters identified or determined at 204A.

In some embodiments, the method illustrated in FIG. 2A may comprise the process 208A of identifying or determining a first set of MP grids for the first layer based at least on the first set of grid parameters and optionally on one or more cost analyses. In some embodiments, the method illustrated in FIG. 2A may comprise the process 210A of identifying or creating an edge map or edge grid (hereinafter edge map) for the first layer using the first set of MP grids.

In some embodiments, the method illustrated in FIG. 2A may comprise the process 212A of populating the edge map with data about various shapes in the layout for the first layer. More details about processes 202A~212A are described in U.S. patent application Ser. No. 13/840,259 entitled "METHODS, SYSTEMS, AND ARTICLES OF MANUFACTURE FOR IMPLEMENTING CORRECT-BY-CONSTRUCTION PHYSICAL DESIGNS WITH MULTIPLE-PATTERNING-AWARENESS", the content of which is hereby incorporated by reference in its entirety for all purposes.

In some embodiments, the method illustrated in FIG. 2A may optionally comprise the process 214A of performing enforced extension for one or more entities in the edge map using the first set of MP grids. More details about enforced extension is provided in subsequent paragraphs with reference to FIG. 4.

In some embodiments, the method illustrated in FIG. 2A may comprise the process 216A of converting, transforming, or translating (hereinafter converting or convert) the first set of design rules identified at 202 into a set of grid-based rules using the first set of grids. For example, process 216A may convert a minimum width rule of 120-nm into a grid-based minimum width rule of +3 grids or −3 grids, where the first set of grids has a grid pitch of 40-nm. It shall be noted that the grid-based rules may be directional in nature, depending on which direction a particular shape in the layout is implemented in some embodiments. Therefore, two interconnects approaching each other and two interconnects running in the same direction (e.g., both from the left-hand side of the layer to the right-hand side of the layer) may be subjected to different rules in these embodiments. More examples about the design rules are provided and described in paragraphs with reference to FIG. 7B.

Moreover, various embodiments ensure that a shape is implemented in the layout with the ends of the shape coinciding with certain grids. In the above example where the grid pitch is 40-nm, any interconnects that fall within, for example, +2 grid (or −2 grid) and +3 grid (or −3 grid) will be automatically extended to +3 grid (or −3 grid) and thus automatically satisfy the trim mask minimum step rule. In addition, any interconnects with line-ends falling between 0 and +2 grids (or between 0 and −2 grids) may also be extended by the enforced extension to +3 grid (or −3 grid) and thus also satisfy the trim mask minimum step rule. As another example, some embodiments may determine the grid pitch to be 120-nm. In this example, all interconnects will be routed to ensure the line-ends of each interconnect coincides with appropriate grids. Therefore, no line-ends will fall between 0 and +1 grid (or between 0 and −1 grid, dependent on the direction of the interconnect). As such, all interconnects will be implemented to satisfy the trim mask minimum step rule, and the generated layout is thus correct by construction without any violation of at least this trim mask minimum step rule.

In some embodiments, the method illustrated in FIG. 2A may comprise the process 218A of performing constant time design rule check for one or more shapes of a set of shapes on the first layer using the edge map. More details about process 218A will be provided below with reference to FIG. 5.

Figure 2B:
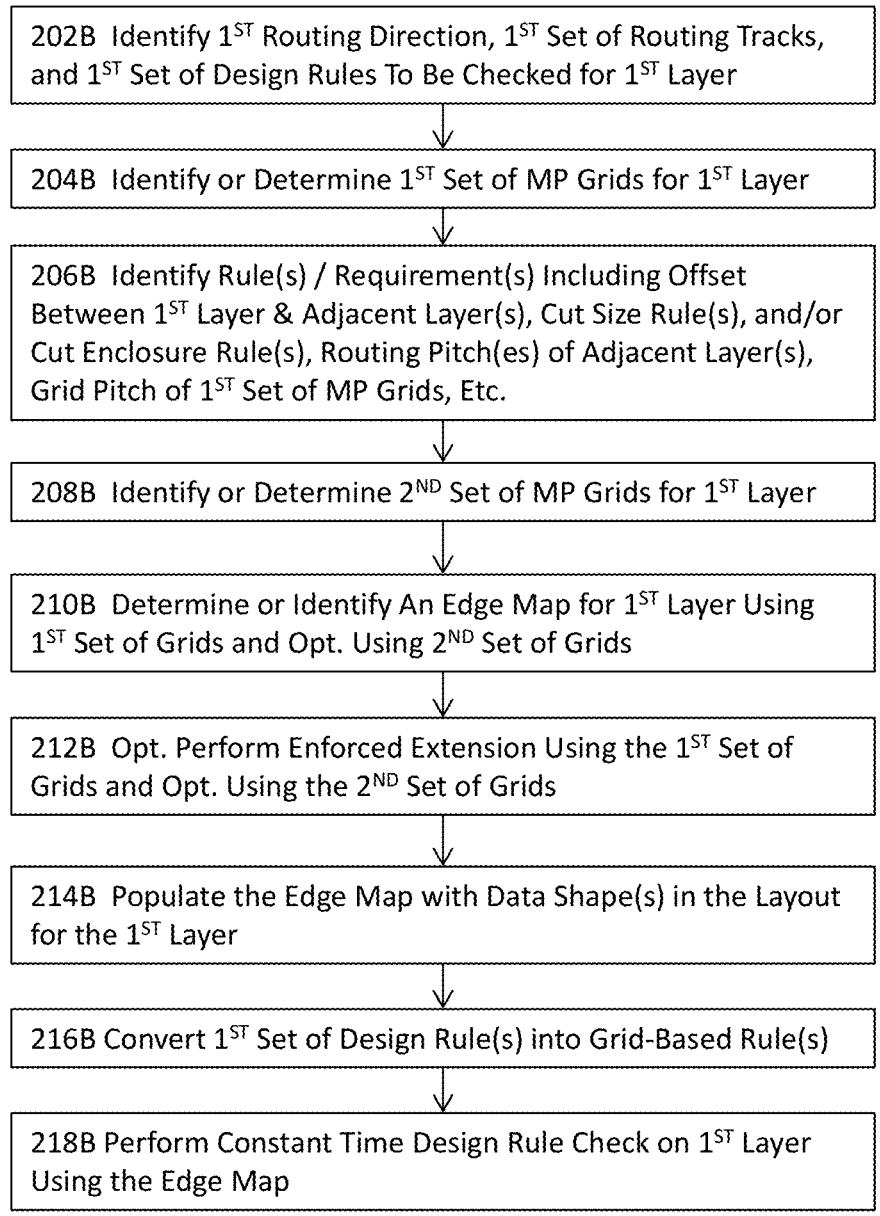
FIG. 2B illustrates a more detailed flow diagram for implementing multiple-patterning-aware design rule check for an electronic design in some embodiments.

FIG. 2B illustrates a more detailed flow diagram for implementing multiple-patterning-aware design rule check for an electronic design in some embodiments. In one or more embodiments, the method illustrated in FIG. 2A may comprise the process 202B of identifying a first routing direction, a first set of routing tracks, and a first set of design rules to be checked for a first layer in a substantially similar manner as that described for 202A.

In some embodiments, the method illustrated in FIG. 2B may comprise the process 204B of identifying or determining a first set of MP grids for the first layer in a substantially similar manner as that described for 208A. In some embodiments, the method illustrated in FIG. 2B may comprise the process 206B of identifying one or more rules, constraints, or requirements (hereinafter rules or rule) that may include, for example but not limited to an offset between the first layer and one or more layers adjacent to the first layer, one or more via cut size rules that limit the size(s) of via cuts, and/or one or more via cut enclosure rules that limit the size(s) of via cut enclosures, one or more routing pitches of the one or more adjacent layers, or a grid pitch of the first set of MP grids, etc.

In some embodiments, the method illustrated in FIG. 2B may comprise the process 208B of identifying or determining a second set of MP grids or high-end grids for the first layer. In some embodiments, the first set of MP grids may comprise the higher grids for the high-ends of shapes in the layout of the first layer, and the second set of MP grids may comprise the lower grids or low-end grids for the low-ends of shapes in the layout of the first layer. In these embodiments, both the higher grids and the lower grids are used to capture the directional nature of the shapes in the layout and thus for the directional nature of some design rules governing the electronic design.

In some embodiments, the method illustrated in FIG. 2B may comprise the process 210B of determining or identifying a data structure, such as an edge map, for the first layer using the first set of grids and optionally using the second set of grids. An edge map includes only the location data for the shape ends of shapes (e.g., interconnects, pins, pads, terminals, etc.), instead of the full geometry layout data for the shapes. The edge map may enhance the efficiency of post-physical design processing tools (e.g., a DRC tool). More details about the edge map are described in U.S. patent application Ser. No. 13/840,717 entitled "METHODS, SYSTEMS, AND ARTICLES OF MANUFACTURE FOR IMPLEMENTING CORRECT-BY-CONSTRUCTION PHYSICAL DESIGNS WITH MULTIPLE-PATTERNING-AWARENESS", the content of which is hereby incorporated by reference in its entirety for all purposes.

In some embodiments, the method illustrated in FIG. 2B may optionally comprise the process 212B of performing enforced extension using the first set of grids and optionally using the second set of grids. More details about the enforced extension are provided below with reference to FIG. 4. In some embodiments, the method illustrated in FIG. 2B may comprise the process 214B of populating the data structure with data about various shapes in the layout for the first layer. In some embodiments where the data structure comprises an edge map, the data includes locational data for the ends of the various shapes in the layout of the first layer.

In some embodiments, the method illustrated in FIG. 2B may comprise the process 216B of converting the first set of design rules identified at 202B into a set of grid-based rules in a substantially similar manner as that described for 216A. In some embodiments, the method illustrated in FIG. 2B may comprise the process 218B of performing constant time design rule check on the first layer using the data structure in a substantially similar manner as that described for 218A. In some embodiments where the data structure comprises an edge map, process 218B performs the constant time design rule check on the firs layer using the edge map.

In the embodiments illustrated in FIG. 2A, the method utilizes one set of MP grids to perform various functions, whereas FIG. 2B illustrates the exemplary embodiments where two sets of grids (e.g., higher grids and lower grids) are used to perform various functions. It shall be noted that the sets of MP grids used in physical implementation of a design may not be the same as the sets of MP grids used in DRC in some embodiments. For example, physical implementation of a design may use one or more sets of finer grids to minimize extensions of shapes to specific grids, and DRC processes may use a set of coarser grids to perform design rule checks.

Figure 3:
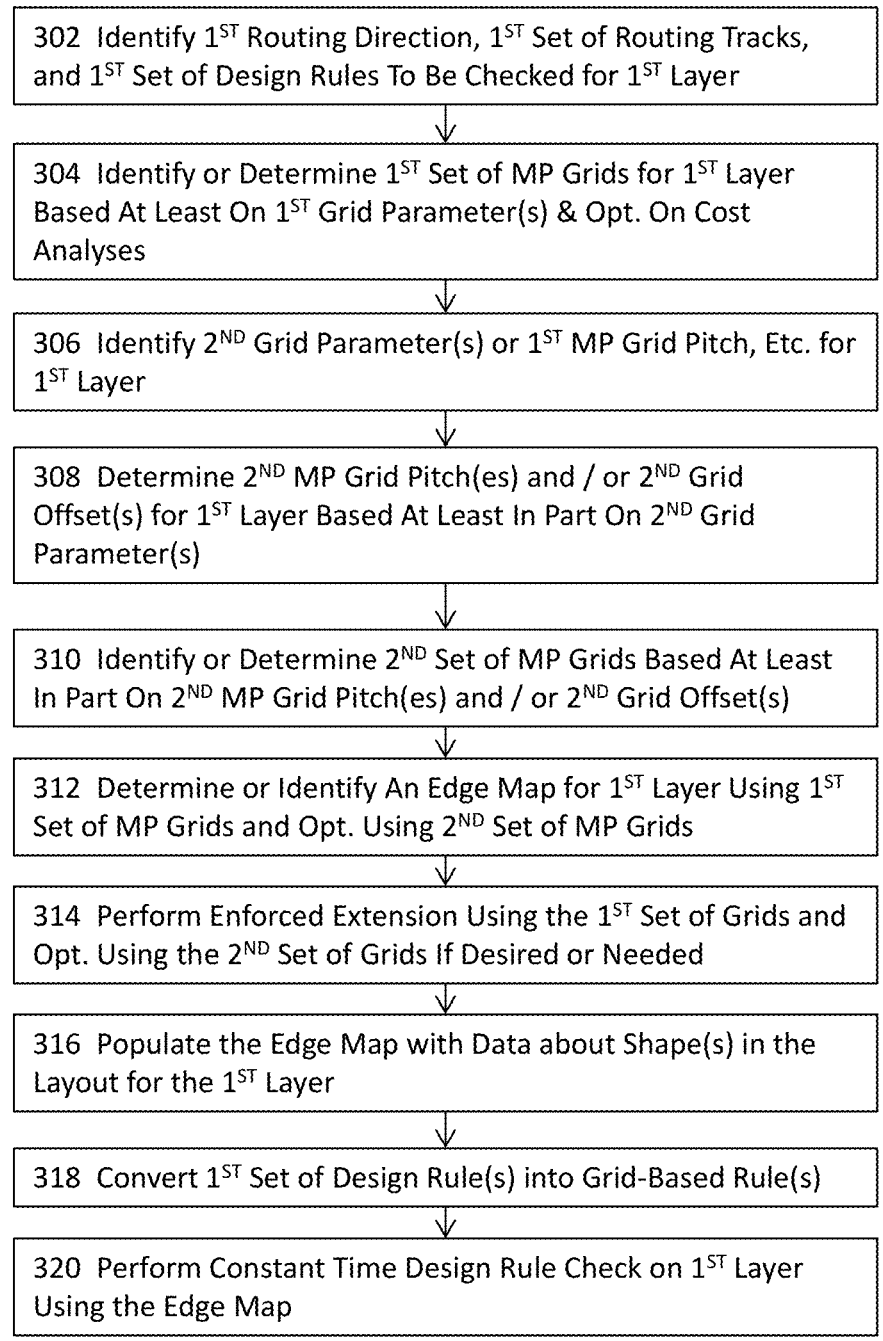
FIG. 3 illustrates a more detailed flow diagram for implementing multiple-patterning-aware design rule check for an electronic design in some embodiments.

FIG. 3 illustrates a more detailed flow diagram for implementing multiple-patterning-aware correct-by-construction layout processing for an electronic design in some embodiments. In one or more embodiments, the method for implementing multiple-patterning-aware correct-by-construction layout processing for an electronic design illustrated in FIG. 3 may comprise the process 302 of Identify a first routing direction, a first set of routing tracks, and a first set of design rules to be checked for the first layer. In some embodiments, the method may include the process 304 of identifying or determining a first set of MP grids for the first layer based at least on one or more first grid parameters and optionally on results of cost analyses. In some embodiments, the one or more first grid parameters include, for example but not limited to, the grid pitch(es), grid offset(s), grid direction(s), or any combinations thereof, etc. for the first set of grids.

In some embodiments, the method may include the process 306 of identifying one or more second grid parameters for the second set of grids or one or more first grid parameters for the first set of grids, etc. for the first layer. In some embodiments, the one or more first grid parameters include, for example but not limited to, the grid pitch(es), grid offset(s), grid direction(s), or any combinations thereof, etc. for the second set of grids. In some embodiments where process 306 identifies one or more second grid parameters, the method may then uses these one or more second grid parameters to determine the second set of grids.

In some embodiments, the method may include the process 308 of determining the second grid pitch(es), the second grid offset(s), and/or the second grid direction(s) for the first layer based at least in part on the one or more second grid parameters or on the one or more first grid parameters. In some embodiments where process 306 identifies the parameters of the first set of grids, the process 308 may then infer or directly use the parameters of the first set of grids for the second set of grids. For example, the process 308 may use the first grid pitch of the first set of grids for the second set of grids. The process 308 may determine the second grid direction for the second set of grids from the first grid direction of the first set of grids.

In some embodiments, the method may include the process 310 of identifying or determining the second set of grids based at least in part on the second grid pitch(es) and optionally on the second grid offset(s). In some embodiments, the method may include the process 312 of determining or identifying an edge map for the first layer using the set of grids and optionally using the second set of grids. In some embodiments, an edge map comprises a two-dimensional data structure to represent an abstraction of shapes on a layer. In these embodiments, the two-dimensional data structure includes the routing tracks, the set(s) of grids, each having a uniform pitch or non-uniform pitches.

In some embodiments with horizontal routing tracks, every point in the edge map represents, high_line_end (a line-end terminating to the right of the originating point of the interconnect), low_line_end (a line-end terminating to the left of the originating point of the interconnect), through_wire, or blank. In some embodiments with vertical routing tracks, every point in the edge map represents, high_line_end (a line-end terminating above the originating point of the interconnect), low_line_end (a line-end terminating below the originating point of the interconnect), through_wire, or blank. In some embodiments, the processes described herein may identify an existing layout, which may be complete or incomplete, and convert the existing layout into an edge map by using the processes described herein. For example, these embodiments may identify the routing pitch(es) from the routed design components in the existing layout, determine the set(s) of grids based at least in part upon the routing pitch(es) and/or other rules, identify the line-ends of the interconnects, and place the identified line-ends in the edge map to generate the edge map.

One of the advantages of the edge map in physical design implementation is that the use of edge maps enables a constant time design rule checking and a constant time search for one or more shapes that violate a design rule, unlike other conventional approaches that search for shapes within a halo and performs comparison between the identified shapes and the rule and thus require the design rule checking time or a search time in an order (n) with regular design databases or order(log(n)) with a tree structure for the search, where n denotes the total number of shapes in a design. In other words, with the edge map data structure that stores the line ends, various DRC or search processes merely examines the edge map to determine the total number of line ends falling within a search radius or halo. Therefore, the search time and thus the check time are constant regardless of the number of shapes or design elements to be searched or checked. Another advantage of this constant time DRC and constant time search is that various embodiments described herein convert the multiple-exposure physical implementation problem (e.g., DRC or routing), which is global in nature, into a local problem.

In some embodiments, the method may include the process 314 of performing enforced extension using the first set of grids and optionally using the second set of grids if desired or needed. Enforced extension is described in the subsequent paragraphs with reference to FIG. 4. In some embodiments, the method may include the process 316 of populating the edge map with data for the shapes in the layout of the first layer.

In some embodiments, the method may include the process 318 of converting the first set of design rule(s) to be checked into corresponding grid-based rules. For example, the trim mask minimum step rule 708B of FIG. 7B may require that two neighboring interconnects running in the same direction have a minimum step of 100-nm. If the grid pitch is 40-nm, the trim mask minimum step rule will be converted to a grid-based trim mask minimum width rule that requires at least three grids. Therefore, when checking the edge map to identify violations of this trim mask minimum step rule, the checking engine or the search engine merely has to examine the edge map to determine the total number of line points that fall within a +3 grids/−3 grids halo, and the search time is thus constant, independent of the total number of shapes or elements in the design.

In some embodiments, the method may include the process 320 of performing a constant time design rule check on the first layer using at least the edge map. The embodiments illustrated in FIG. 3 show a use model of various processes or module for implementing multiple-patterning-aware correct-by-construction layout processing for an electronic design. More details about the layout processing are described in U.S. patent application Ser. No. 13/840,259 entitled "METHODS, SYSTEMS, AND ARTICLES OF MANUFACTURE FOR IMPLEMENTING MULTIPLE-PATTERNING-AWARE CORRECT-BY-CONSTRUCTION LAYOUT PROCESSING FOR AN ELECTRONIC DESIGN", the content of the which is hereby incorporated by reference in its entirety for all purposes.

Figure 4:
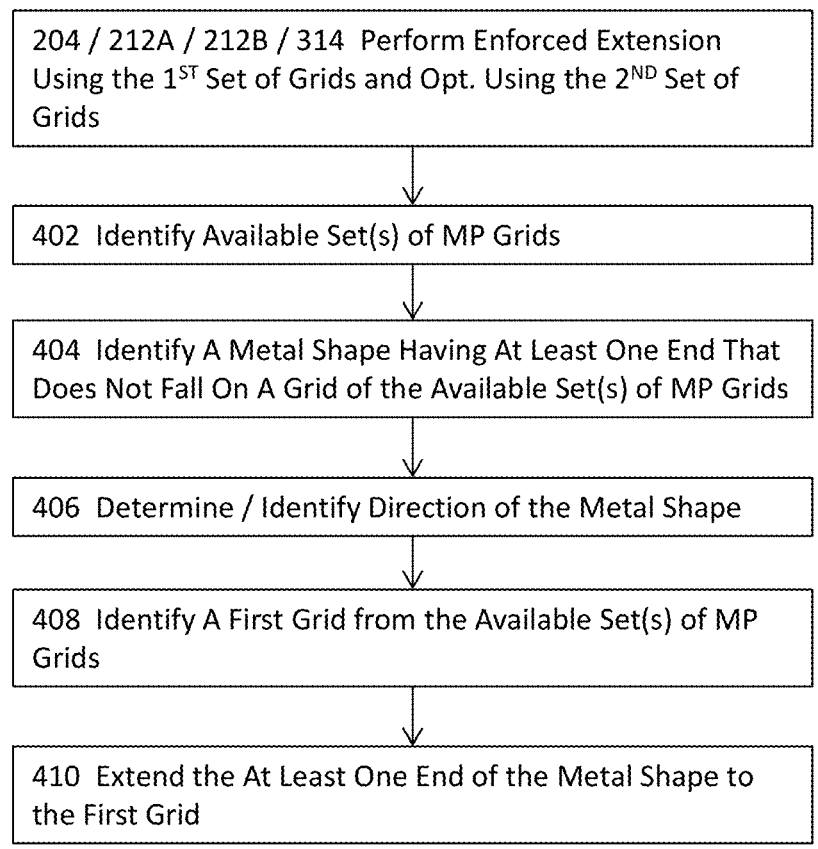
FIG. 4 illustrates more details about a process in FIGS. 2, 2A-B, and 3 in some embodiments.

FIG. 4 illustrates more details about a process in FIGS. 2, 2A-B, and 3 in some embodiments. More specifically, FIG. 4 illustrates the process 204, 212A, 212B, or 314B for performing enforced extension of shapes (e.g., interconnects, pins, pads, terminals, etc.) using one or more sets of MP grids in some embodiments. In some of these embodiments, the process may perform enforced extension using the first set of grids and optionally using the second set of grids. In one or more embodiments, the process illustrated in FIG. 4 comprises the process 402 of identifying available sets of grids. In some embodiments where only the first set of MP grids (high grids) is available, process 402 identifies the first set of grids.

In some embodiments where both the first set of MP grids (high grids) and the second set of MP grids (low grids) are available, process 402 may identify the high grids, the low grids, or both. In some embodiments, the process may include the process 404 of identifying a metal shape (e.g., an interconnect) that has at least one end that does not fall on a grid of the identified set(s) of grids. For example, process 404 may identify a wire having one line end that does not fall on any grid of the available sets of grids identified at 402. In some embodiments, enforced extension may be performed after a shape is implemented in the layout editor. In some embodiments, enforced extension may be performed in the edge map by adjusting the data for shape ends to ensure that shape ends coincide with the grids.

In some embodiments, the process may include the process 406 of determining or identifying the direction or orientation of the metal shape. For example, process 406 may identify that the interconnect identified at 404 terminates to the right (or left, above, or below) of the starting point of the interconnect. In some embodiments, the process may include the process 408 of identifying a first grid from the available sets of grids identified at 404. For example, process 408 may identify the next closest grid from a set of grids identified at 404. In these embodiments, the next closest grid is identified at 408 to minimize extension and hence to minimize wire length where the metal shape constitutes an interconnect.

In some embodiments, the process may include the process 410 of extending at least one end of the metal shape to the grid identified at 408. In the example for 406 above, process 410 may extend the interconnect to the right so that the interconnect terminates at the identified grid identified at 408. It shall be noted that the method or some other processes (e.g., a design rule check process) may further check to determine whether the metal shape (now extending to the identified grid) satisfies one or more design rules, requirements, or constraints (collectively "design rules"). If the method or these processes determines that the extended metal shape fails to meet one or more design rules, process 410 may extend at least one end of the metal shape to the next closest grid in the identified sets of grids. In these embodiments, the next closest grid is identified at 408 to minimize extension and hence to minimize wire length where the metal shape constitutes an interconnect.

Figure 5:
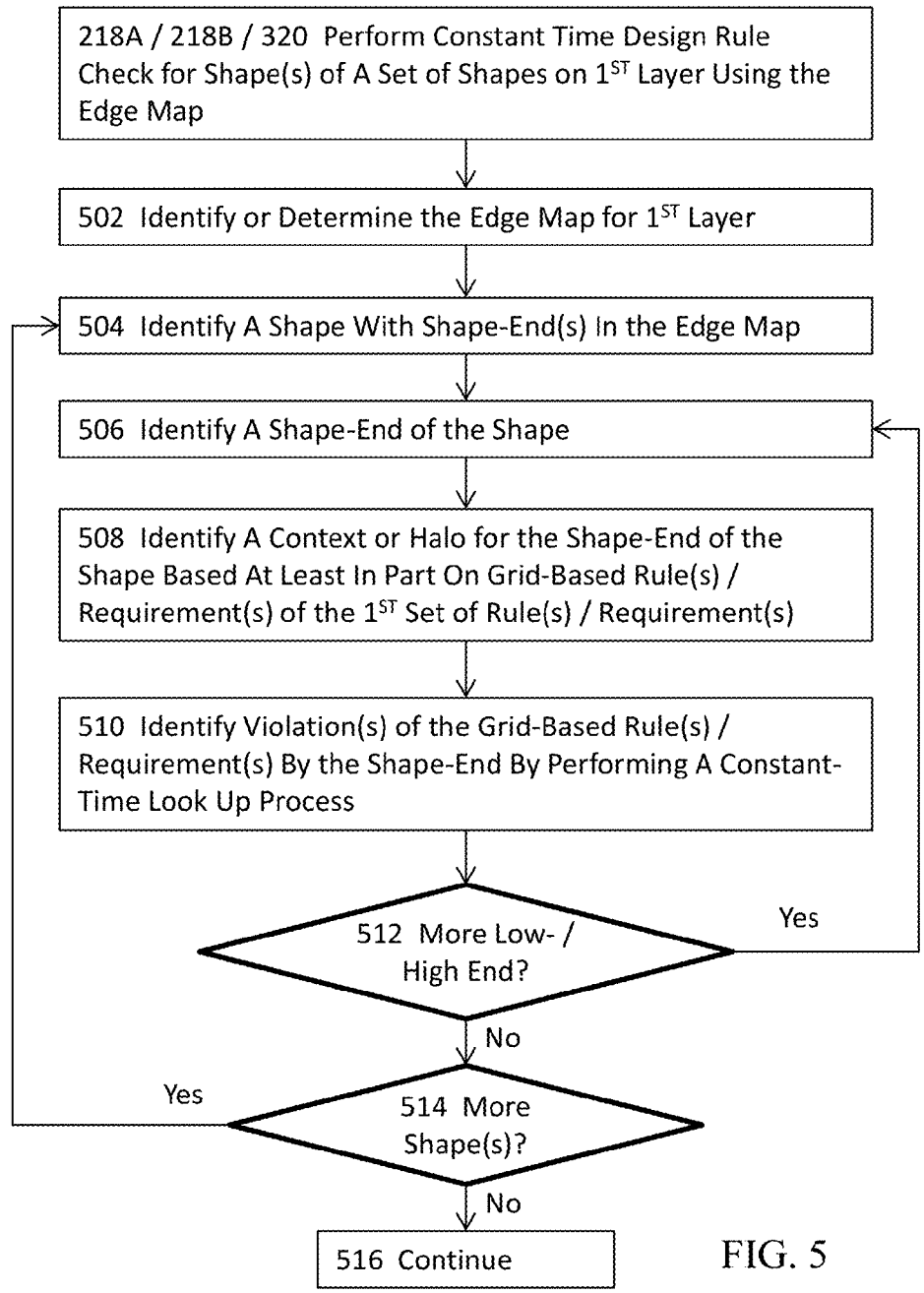
FIG. 5 illustrates more details about a process in FIGS. 2A-B and 3 in some embodiments.

FIG. 5 illustrates more details about a process in FIGS. 2A-B and 3 in some embodiments. More specifically, FIG. 5 illustrates more details about the process 218A, 218B, or 320 for performing constant time design rule checking for one or more shapes of a set of shapes on the first layer of an electronic design using an edge map. In some embodiments, the process illustrated in FIG. 5 may comprise the process 502 of identifying or determining the edge map for the first layer. In some embodiments where the edge map has not been created, process 502 may determine or generate the edge map for the first layer of the design.

In some embodiments, the process illustrated in FIG. 5 may comprise the process 504 of identifying a shape with multiple shape-ends in the edge map. In some embodiments, the process illustrated in FIG. 5 may comprise the process 506 of identifying a specific shape-end from the multiple shape-ends of the shape in the edge map. For example, process 506 may identify a low-line-end of an interconnect or a high-line-end of an interconnect in some embodiments.

In some embodiments, the process illustrated in FIG. 5 may comprise the process 508 of identifying a context or a halo for the specific shape-end of the shape identified at 506 based at least in part on one or more grid-based rules of the first set of rules. For example, if the method is to perform a design rule check for a minimum trim mask step rule (e.g., rule 708B of FIG. 7B) requiring 120-nm minimum step between interconnects running in the same direction for a first interconnect with a high-line-end at, for example, (x, y) in a first set of grids having a grid pitch of 40-nm, process 508 may determine or identify a context or a halo of +3 grids and −3 grids for the high-line-end of the first interconnect. In this example, the requirement of a minimum step of +3 grids or −3 grids for a shape end represents a grid-based minimum trim mask step rule. In this example, the process 508 may further identify +n grid or routing track (e.g., +1 routing track, depending on the availability of another set of grids orthogonal to the first set of grids for the trim mask minimum step rule) and −n grid or track (e.g., −1 routing track) to define the halo or context of search and DRC such that the subsequent process 510 may simply look up the violations from the edge map.

In some embodiments, the process illustrated in FIG. 5 may comprise the process 510 of identifying one or more violations of the one or more grid-based rules, which correspond to the first set of rules identified at, for example, 302, caused by the shape-end identified at 506. In the above example for 508, the process 510 may examine the context and look up all the violations from the edge map, which already includes all the data for the line ends of interconnects in the first layer, without having to perform a search for shapes and a comparison of the identified shapes with the rule to determine whether there is a violation between two interconnects within the context or halo. Therefore, the search process to identify the shapes and hence the subsequent DRC process to determine whether there is a violation of a rule requires only a constant time period (order(1)) because all the requisite data (the geometric data for all the shape ends in the layer) is already included in the edge map. This constant time search and constant time DRC process are in sharp contrast with conventional searches and conventional DRC processes, which are often order(log(n)) or even order(n) and therefore depend upon the total number (n) of shapes and thus the size of the layout.

In some embodiments, the process illustrated in FIG. 5 may optionally comprise the process 512 of determining whether or not there is another shape-end of the shape identified at 504 to process. In these embodiments, the process illustrated in FIG. 5 checks all the shape ends of one shape to determine whether or not the shape violates any design rules. In some embodiments where it is determined that there is another shape-end for the shape, the process returns to 506 and repeats the processes 506~512 until all shape-ends of the shape have been processed. Otherwise, the process illustrated in FIG. 5 proceeds to 514. In some embodiments where an edge map for the first layer is used for identifying the one or more violations, the process may identify the shape-end data (e.g., the coordinates for one line-end of an interconnect) from the edge map and performs a look-up in the edge map with respect to the halo or context identified at 508 to identify any violations within the context or halo.

In some embodiments, the process illustrated in FIG. 5 may comprise the process 514 of determining whether there exist another shape to be processed. In some embodiments where it is determined that there is another shape to be processed, the process returns to 504 and repeats the processes 504~514 until all shapes have been processed. Otherwise, the process illustrated in FIG. 5 proceeds to 516 to continue with, for example, processing another layer of the electronic design.

Figure 6:
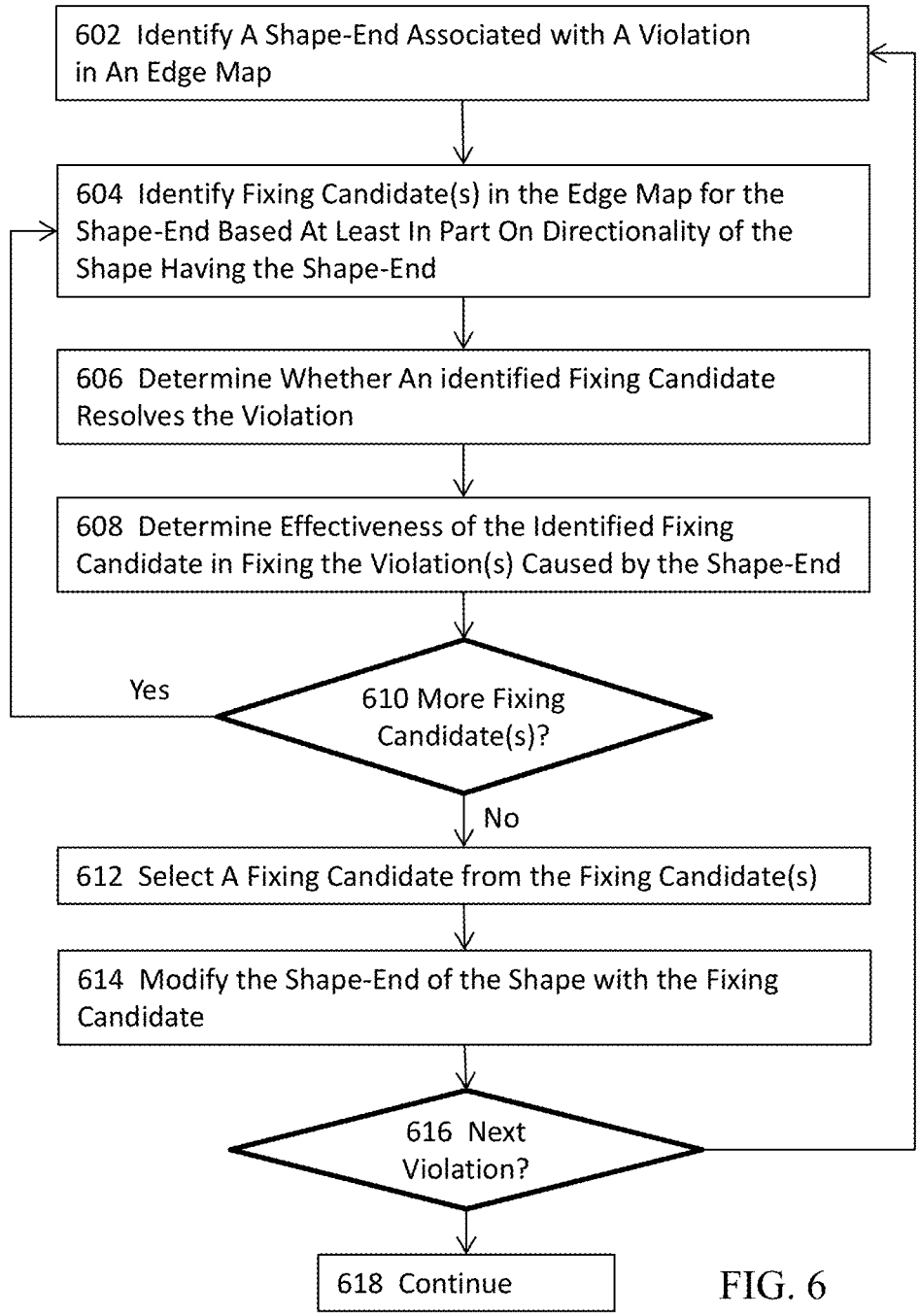
FIG. 6 illustrates a more detailed flow diagram for implementing multiple-patterning-aware design rule violation fixes for an electronic design in some embodiments.

FIG. 6 illustrates a more detailed flow diagram for implementing multiple-patterning-aware design rule violation fixes for an electronic design in some embodiments. In one or more embodiments, the method illustrated in FIG. 6 may comprise the process 602 of identifying a shape-end associated with a violation in an edge map. In some embodiments, the method illustrated in FIG. 6 may begin with the shape that has caused the most number of violations. In some embodiments, the method illustrated in FIG. 6 may begin with any shape that has caused one or more violations, regardless of the total number of violations with which a shape is associated.

In some embodiments, the method illustrated in FIG. 6 may comprise the process 604 of identifying one or more fixing candidates in the edge map for the shape-end based at least in part on directionality of the shape having the shape-end. For example, process may identify one or more next closest grid locations based at least in part upon the location of the shape end relative to the shape (e.g., whether the shape end is a high-end or the low-end of the shape.) In some embodiments, the process 604 may consider only extending the shape in determining the one or more fixing candidates of the shape. In some embodiments, the process 604 may consider only contracting the shape in determining the one or more fixing candidates of the shape. In some embodiments, the process 604 may consider both extending the shape and contracting the shape in determining the one or more fixing candidates of the shape.

In some embodiments, the method illustrated in FIG. 6 may comprise the process 606 of determining whether an identified fixing candidate resolves the violation. In some embodiments where an edge map is used, process 606 may simply examine the context or halo associated with the rule to determine whether an fixing candidate resolves the violation. If an identified fixing candidate fails to resolve the violation, process 606 may determine whether the next identified fixing candidate resolves the violation. If none of the identified fixing candidates resolves the violation, and all the identified fixing candidates are thus deemed as ineffective, the method may return to 604 to identify other fixing candidates.

For example, if process 604 identifies some fixing candidates by considering extending a shape, but none of the identified fixing candidates resolves a violation, process 604 may identify one or more additional fixing candidates that further extend the shape or one or more fixing candidates that contract the shape and determine whether at least one of these one or more additional fixing candidates resolves the violation at 606. If none of the one or more additional fixing candidates fails to resolves the violation, the shape that is associated with the violation may need to be redone.

In some embodiments, the method illustrated in FIG. 6 may comprise the process 608 of determining the effectiveness of the identified fixing candidate in fixing the violation caused by the shape-end. The effectiveness of the identified fixing candidate may include, for example but not limited to, the amount of extension or contraction that the identified fixing candidate causes, whether or not the identified fixing candidate fixes the violation, or whether the identified fixing candidate causes other violations, etc.

In some embodiments, the method illustrated in FIG. 6 may comprise the process 610 of determining one or more additional fixing candidates. For example, if none of the identified fixing candidates resolves the violation, and all the identified fixing candidates are thus deemed ineffective, the method may return to 604 to identify other fixing candidates. As another example, if an identified fixing candidate resolves the violation nonetheless causes one or more other violations and is thus deemed ineffective at 608, the method may also proceed to 610 and then returns to 604 to identify one or more additional fixing candidates. As another example, if process 604 identifies some fixing candidates by considering extending a shape to fix a violation, but none of the identified fixing candidates resolve the violation, the method may return to process 604 which may again identify one or more additional fixing candidates that further extend the shape or one or more fixing candidates that contract the shape or both one or more additional candidates some of which further extend and some others contract the shape and determine whether at least one of these one or more additional fixing candidates resolves the violation at 606. If none of the one or more additional fixing candidates fails to resolves the violation, the shape that is associated with the violation may need to be redone.

In some embodiments, the method illustrated in FIG. 6 may comprise the process 612 of selecting a fixing candidate from the one or more fixing candidates or the one or more additional fixing candidates identified at 604. In some embodiments, the method illustrated in FIG. 6 may comprise the process 614 of modifying the shape-end of the shape with the selected fixing candidate. In some embodiments, the method illustrated in FIG. 6 does not necessarily proceed through the fixing candidate selection as described in 612 but directly applies the fixing candidate that is closest to the shape-end of the shape to modify the shape and then proceeds to 606 to determine whether the modified shape resolves the violation by, for example, performing a look up process in the edge map as described above.

In some embodiments, the method illustrated in FIG. 6 may comprise the process 616 of determining whether there is another violation to be fixed. In some embodiments where process 616 determines that there is an additional violation to be fixed, the method illustrated in FIG. 6 may return to 602 to identify a shape-end that is associated with this additional violation. Otherwise, the method may proceed to 618 to continue with, for example, processing another layer in substantially similar manner as described above.

Figure 7A:
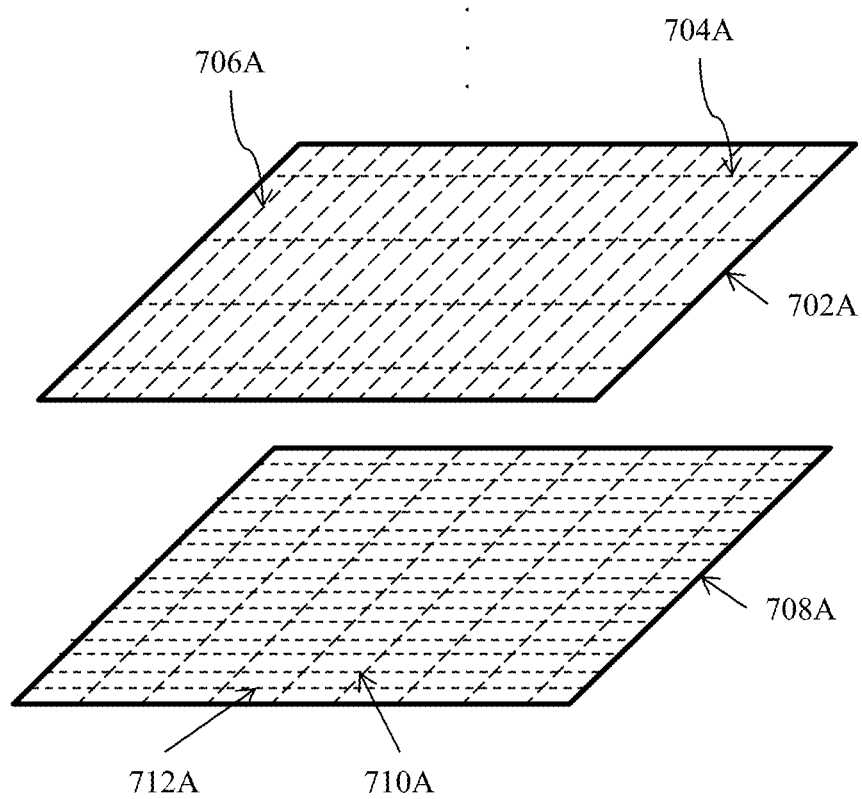
FIG. 7A illustrates an exemplary of routing tracks and a set of multi-exposure grids for each metal layer in some embodiments.

FIG. 7A illustrates an exemplary of routing tracks and a set of multi-exposure grids for each metal layer in some embodiments. More specifically, FIG. 7A illustrates two routing layers—metal 1 (M1) 708A and metal 2 (M2) 702A. Metal 1 routing layer 708A may have a set of routing tracks 710A in a first direction having uniform or non-uniform routing pitches. Metal 1 routing layer 708A may also have a set of grids 712A in a second direction. In some embodiments where the Manhattan routing grids are used, the second direction is perpendicular to the first direction. Metal 2 routing layer 702A includes a set of routing tracks 704A with uniform or non-uniform routing pitches in the second direction and a set of grids 706A in the first direction. In these embodiments illustrated in FIG. 7A, the routing tracks and the MP grids are always in two different routing directions on each layer.

Figure 7B:
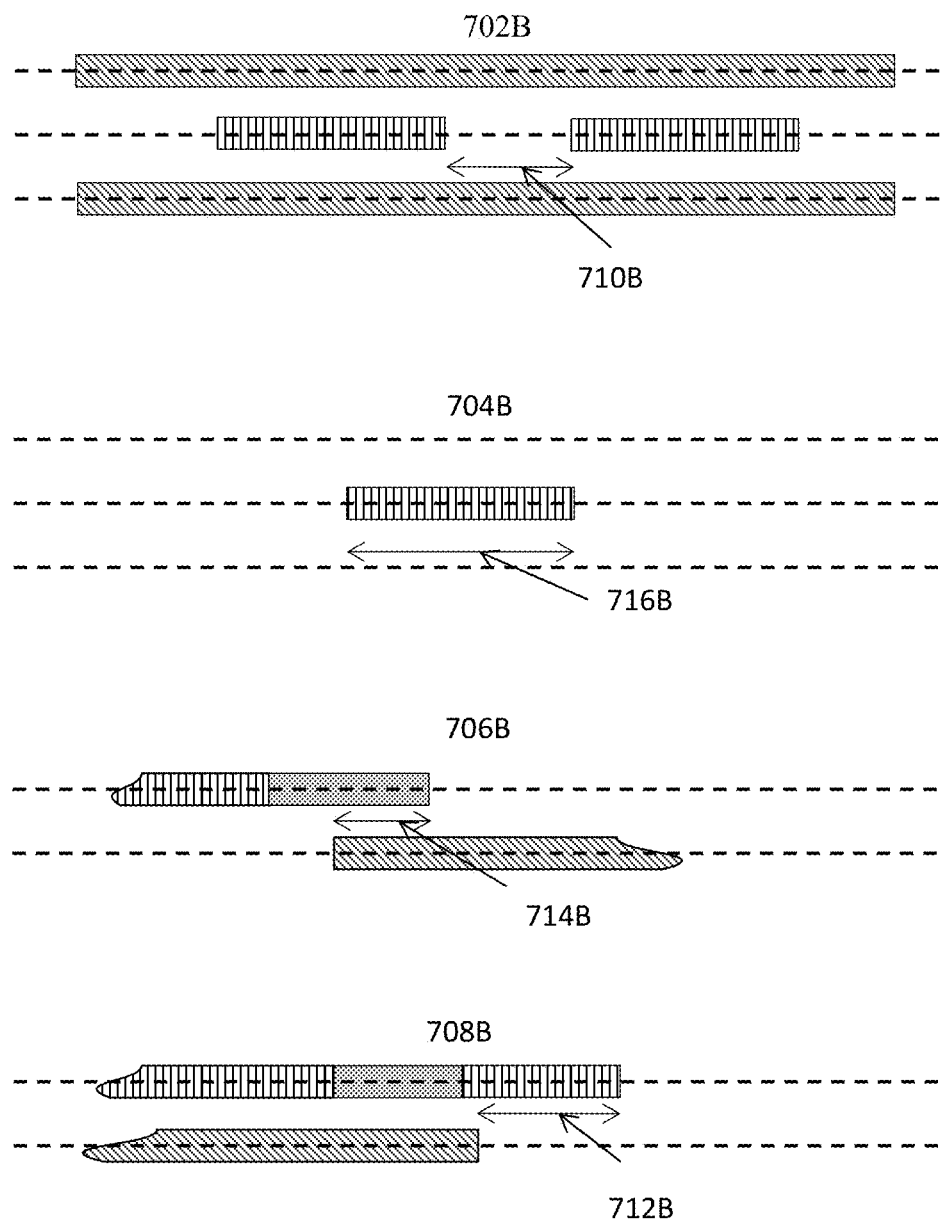
FIG. 7B illustrates some exemplary multi-exposure trim mask rules in some embodiments.

FIG. 7B illustrates some exemplary multi-exposure trim mask rules in some embodiments. 702B illustrates the trim mask minimum width rule where 710B represents the minimum spacing between two interconnects. 704B illustrates the minimum area rule that requires a minimum length 716B for a shape. For interconnects in advanced technology nodes, the area of one of the shapes is proportion to its length. Therefore, the minimum area rule imposes a minimum length for each interconnect. 706B represents the trim mask spacing rule that requires two neighboring interconnects running in opposite direction to have a minimum overlapping distance 714B. 708B represents the trim mask minimum step rule that requires two neighboring interconnects running in the same direction to have a step having a minimum step of 712B.

For example, if a design rule requires that two interconnects running in opposite direction to have a minimum spacing of 130-nm or −60-nm (e.g., 714B is to be greater than +130-nm or smaller than −60-nm). If the grid pitch is 60-nm, the above design rule may be converted to be +3 grids (130/60>2 grids) and −1 grid (60/60=1 grid). Therefore, a design check process described herein may simply look up, for any high-line-end at (x, y), whether there is a low_line_end that falls on (x−1, y+/−1), (x, y+/−1), (x+1, y+/−1), (x+2, y+/−1), and (x+3, y+/−1). If the look up results in any such line-ends, there will be violations of the design rule 706B. As another example, if the design rule (e.g., rule 708B) requires that two interconnects running in the same direction to have a minimum spacing of zero or greater 100-nm. If the grid pitch is 40-nm, such a design rule may be converted into a grid-based design rule requiring zero grid or +3 grids because 100/40>2 grids. Therefore, a design rule check process may, for a high-line-end at point (x, y), simply look up in the edge map to determine whether there are any high-line-ends at the following points in the edge map: (x+1, y+/−1), (x+2, y+/−1), (x−1, y+/−1), and (x−2, y+/−1). As it can be seen this look up process is a constant time process because the edge map already includes the data for all the line ends, and this process thus does not depend on the total size of the layout or the total number of shapes in the layout.

Figure 7C:
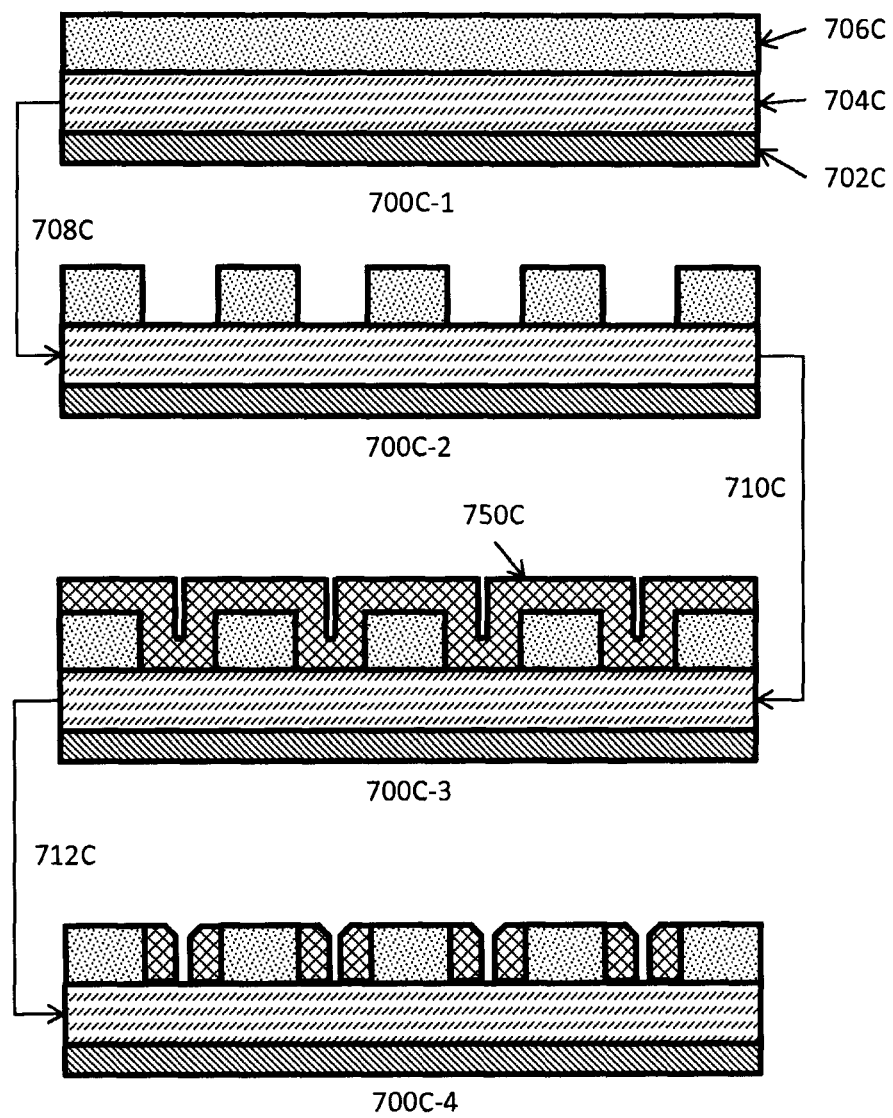
FIGS. 7C-D jointly illustrate a simplified schematic representation of a self-aligned image transfer process in some embodiments.
Figure 7D:
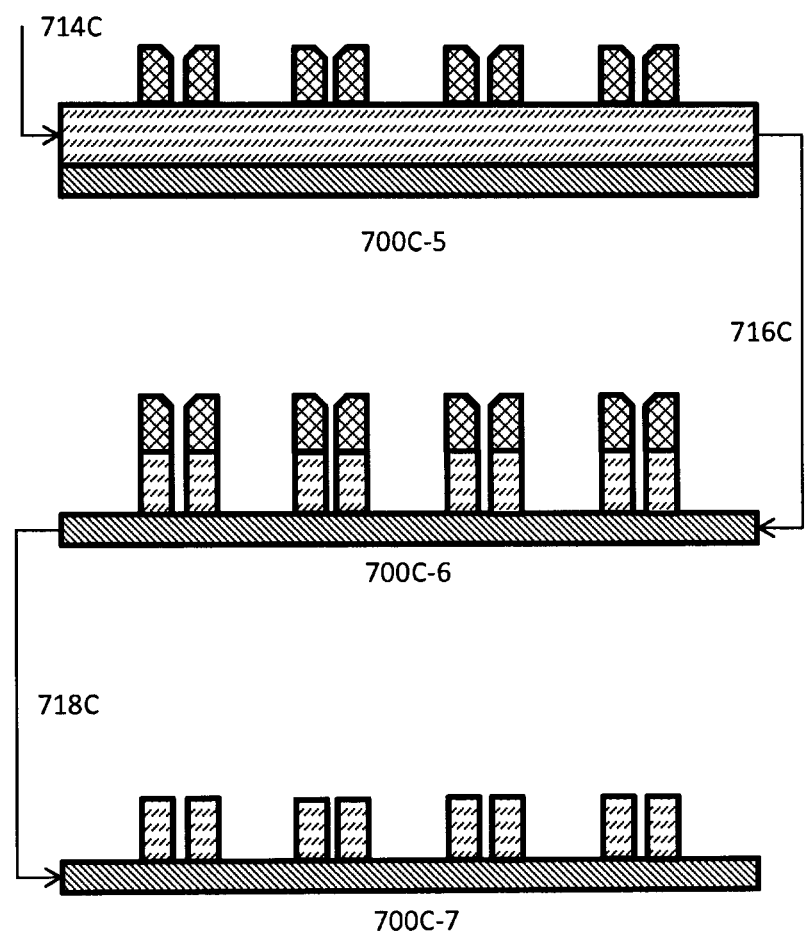

FIGS. 7C-D jointly illustrate a simplified schematic representation of a self-aligned image transfer process in some embodiments. The schematic representation of the process starts with a stack of three layers 700C-1-substrate 702C followed by the deposited hard mask etch layer in, for example, poly-silicon 704C with the photo resist 706C on top. 708C represents a core lithography process to form 700C-2 in which the photo resist 706C is exposed to form the particular pattern as shown in 700C-2. The stack 700C-2 then undergoes a spacer deposition process 710C to form the spacer 750C on top of the patterned photo resist 706C in 700C-2. A spacer comprises a film layer formed on the sidewall of a pre-patterned feature (e.g., the photo resist feature in 700C-2 formed by the core lithography exposure).

The SADP process then uses the trim mask for trimming the spacer. A resulting stack is then shown in 700C-3 which is subsequently processed by an etching process 712C to form the stack 700C-4 where the spacer 750C above the photo resist 706C is etched away. Because there are two spacers for each feature in the photo resist, the density of features may thus be doubled, or the pitch may be halved with the use of spacers. The stack 700C-4 then undergoes the spacer sidewall formation process 714C to form the stack 700C-5 where the photo resist 706C in 700C-4 is removed. Stack 700C-5 is then processed with another etching step to pattern the hard mask etch layer 704C to form the patterned stack 700C-6 that is further processed by a positive tone spacer removal etching process to form the final pattern of the hard mask illustrated in stack 700C-7.

Figure 8A:
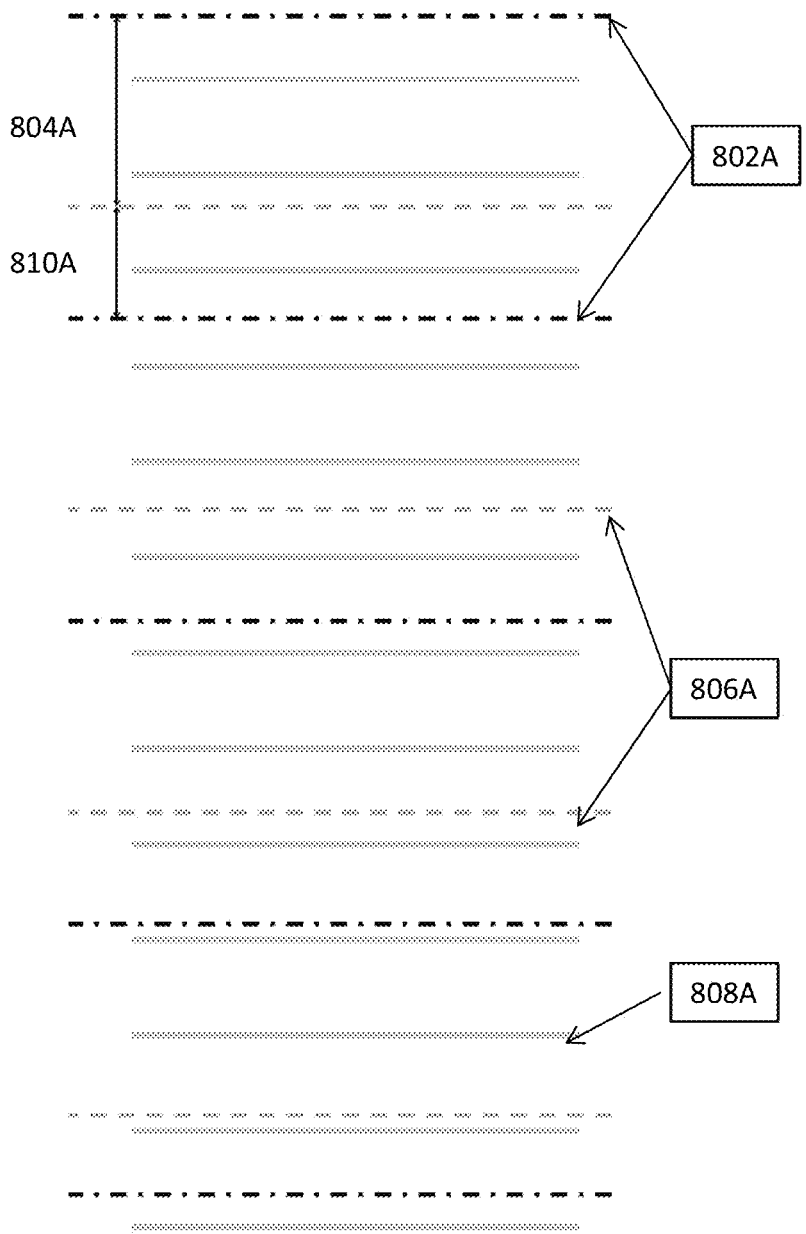
FIGS. 8A-E illustrate some exemplary implementations of a portion of a layer in an electronic design with processes described herein in some embodiments.

FIGS. 8A-E illustrate some exemplary implementations of a portion of a layer in an electronic design with processes described herein in some embodiments. FIG. 8A illustrates a set of lower grids 802A, a set of higher grids 806A, a set of routing tracks 808A, the trim mask spacing 804A, and the trim mask width 810A. In this example illustrated in FIG. 8A, the grid pitch for both the lower grids and the higher grids is determined to be the sum of the trim mask spacing and the trim mask width (or 804A+810A). The offset of both the higher and lower grids is the trim mask spacing, 804A.

Figure 8B:
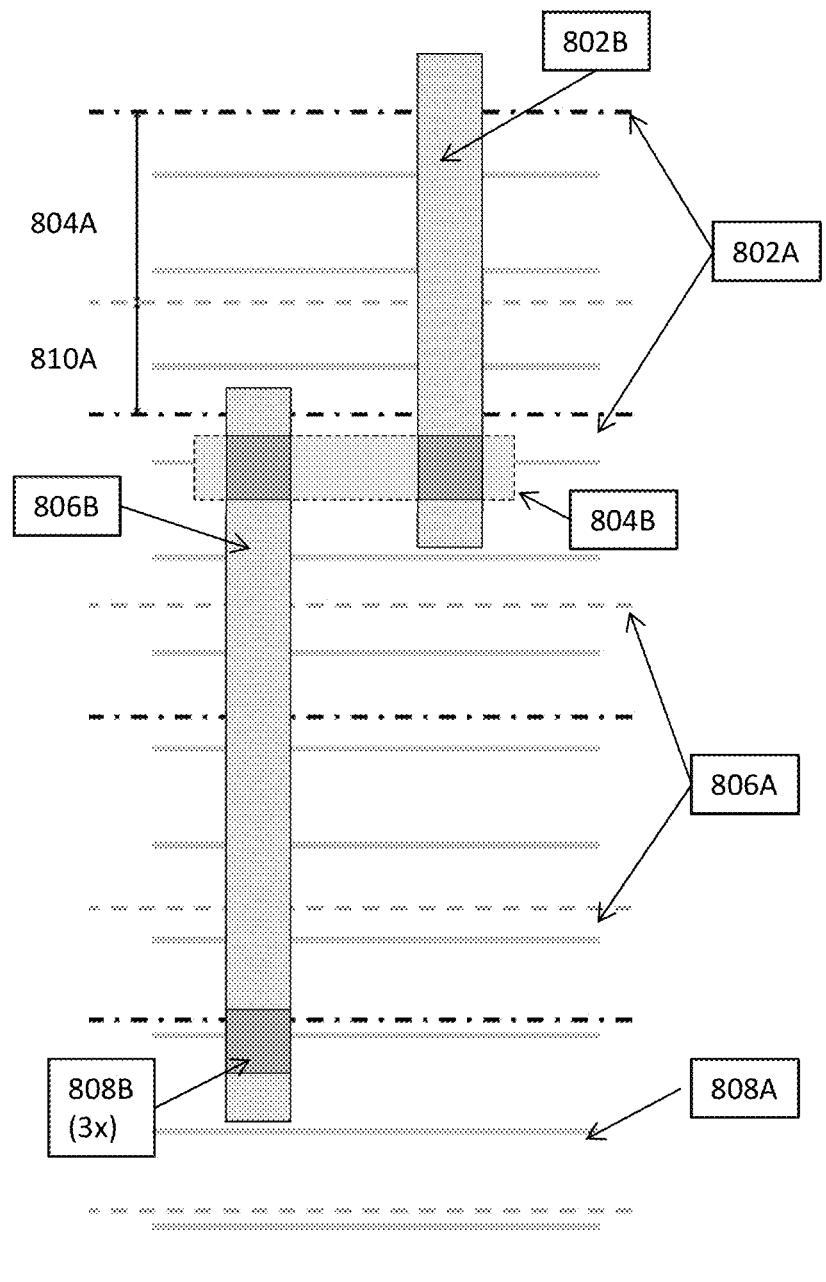

FIG. 8B shows additions of shapes (interconnects and vias) to the layout space. More specifically, FIG. 8B illustrates laying out the center of an interconnect 804B on the first routing layer with a horizontal routing direction along the first set of routing tracks 808A. Interconnects 802B and 806B are laid out along the second set of routing tracks (not shown) on the second routing layer (not shown) that has a vertical routing direction. FIG. 8B further shows the first layer and the routing layer permits one routing direction, and thus only the right-way interconnects are show for each layer. FIG. 8B thus shows the addition of vias (808B) at the interconnects between the first layer interconnect (806B) and the second layer interconnects (802B and 806B).

Figure 8C:
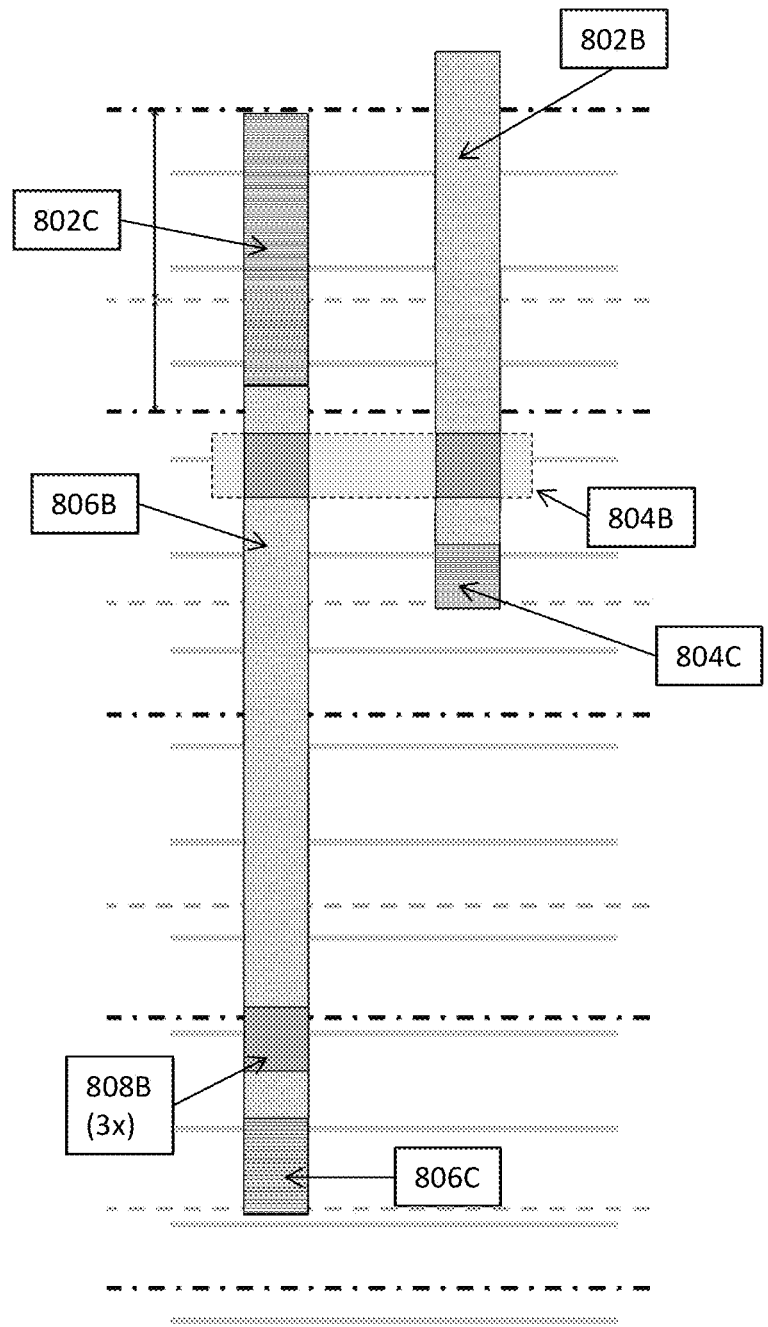

FIG. 8C illustrates the application of various processes described herein. More specifically, FIG. 8C illustrates that both line ends of the interconnect 806B originally do not fall on any grids, and that the low-line-end of interconnect 802B also does not fall on any grid. As a result, various processes extend the high-line-end of 806B to a higher grid to include the segment 802C in the interconnect 806B. Various processes also extend the low-line-end of 806B to a lower grid to include the segment 808C in the interconnect. Similarly, various processes also extend the low-line-end of 802B to a lower grid in the same set of lower grids as that for the extension 806C to include the segment 804C in the interconnect 802B.

Figure 8D:
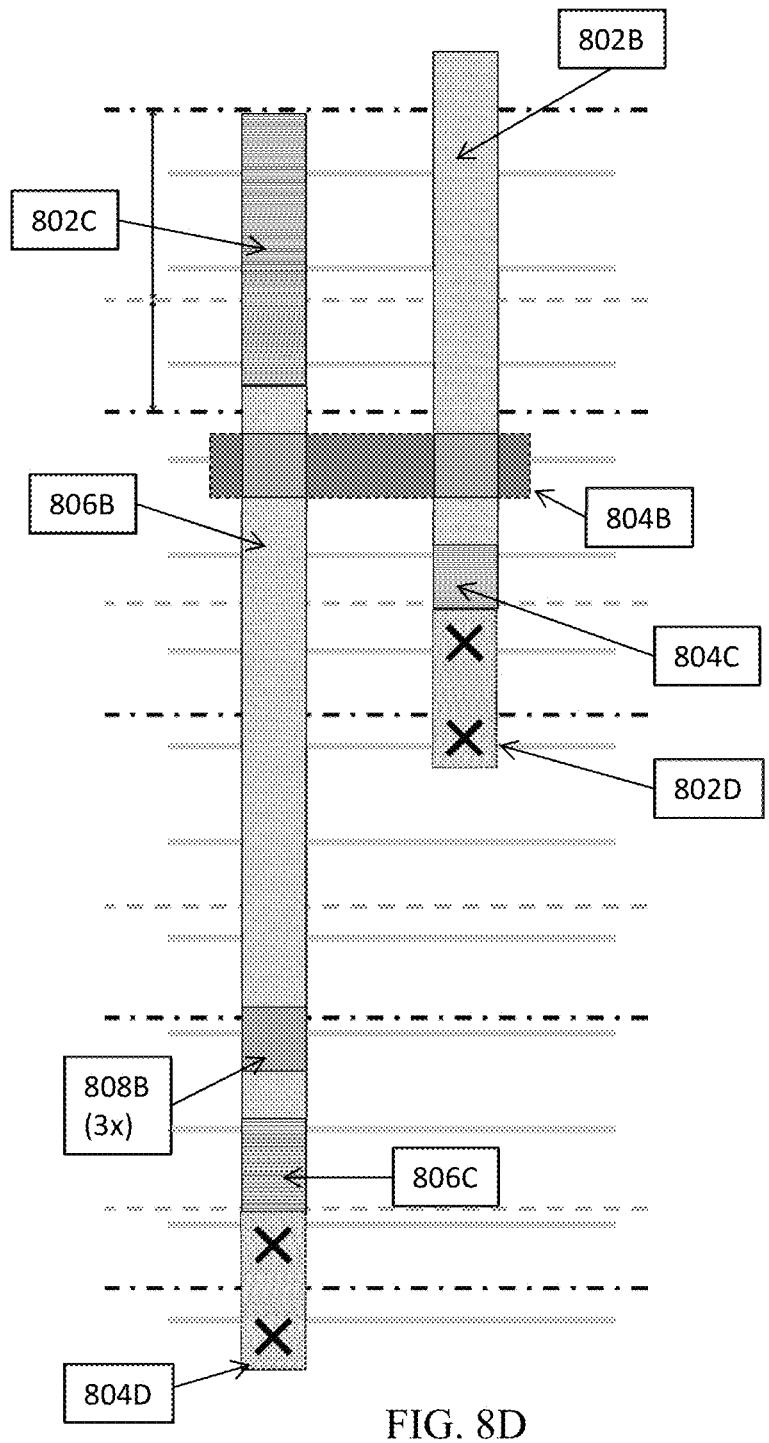
Figure 8E:
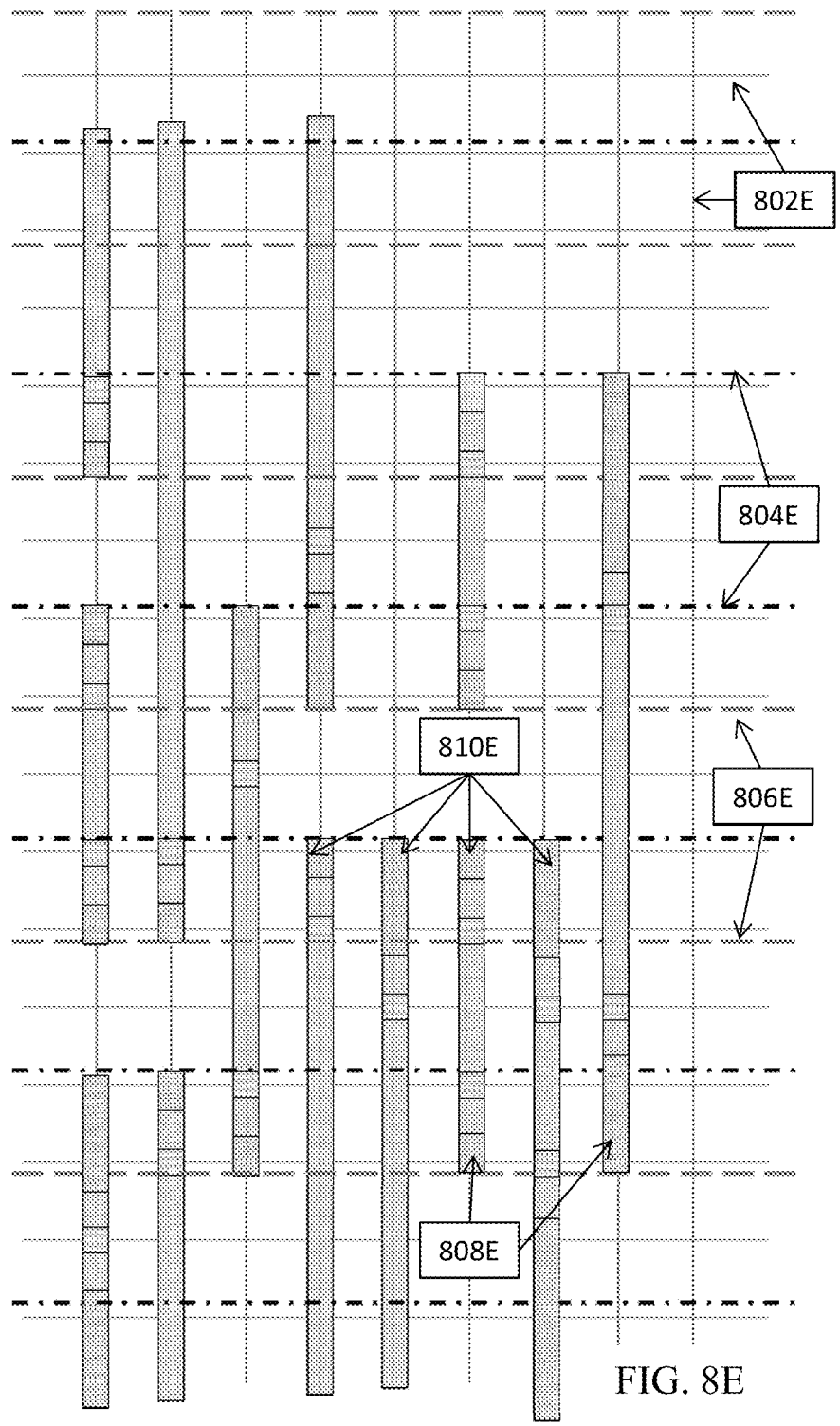

FIG. 8D illustrates the reservation of additional space 804D in the direction of extension when various processes extend the low-line-end of 808B to include the segment 806C in interconnect 806B. FIG. 8E illustrates a larger portion of a layer in a layout. More specifically, the layer illustrated in FIG. 8E includes a first set of horizontal routing tracks (and optionally a second set of vertical routing tracks) 802E, a first set of grids (e.g., higher grids) 804E, and a second set of grids (e.g., lower grids 806E). FIG. 8E also shows that high-line-ends 810E of some interconnects to a grid in the first set of grids, and low-line-ends 808E of some interconnects to a lower grid in the second set of grids.

Figure 9A:
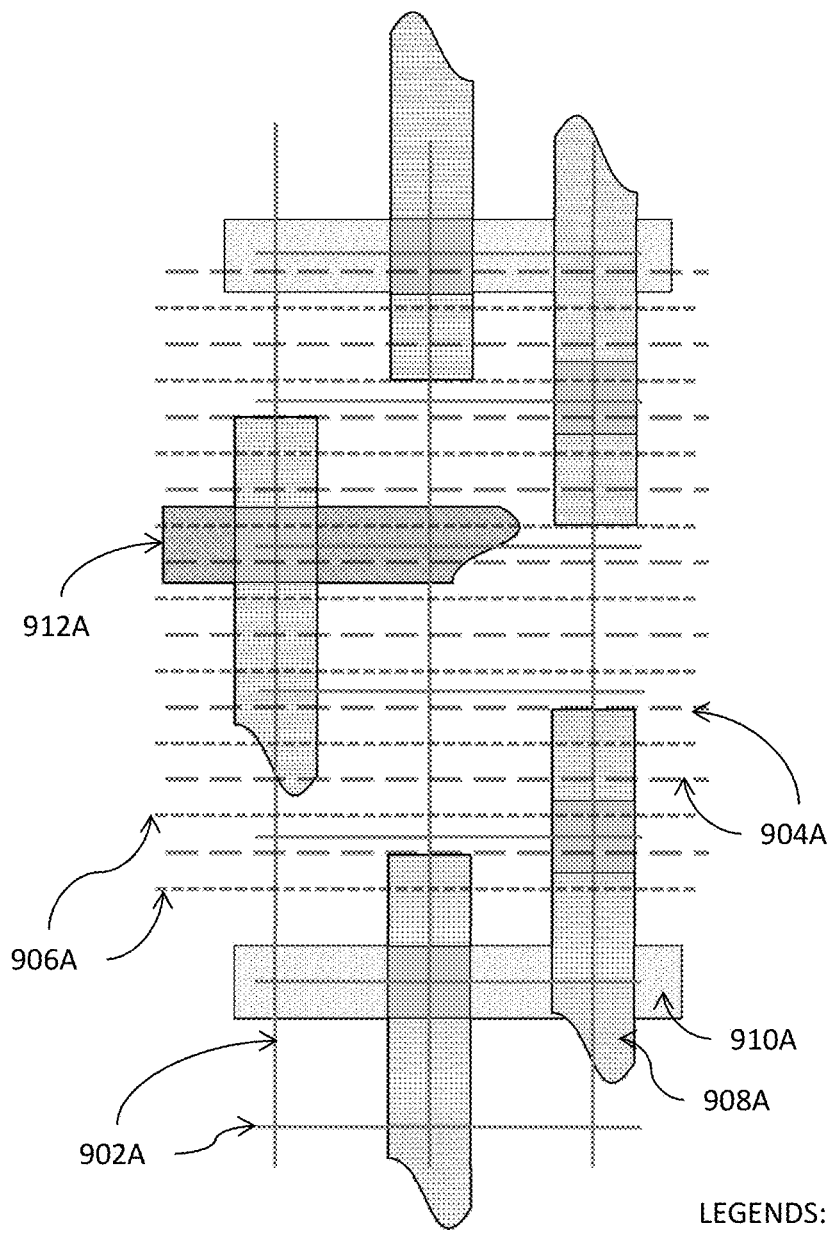
FIGS. 9A-C illustrate an exemplary implementation of the process illustrated in FIG. 4 in some embodiments.
Figure 9B:
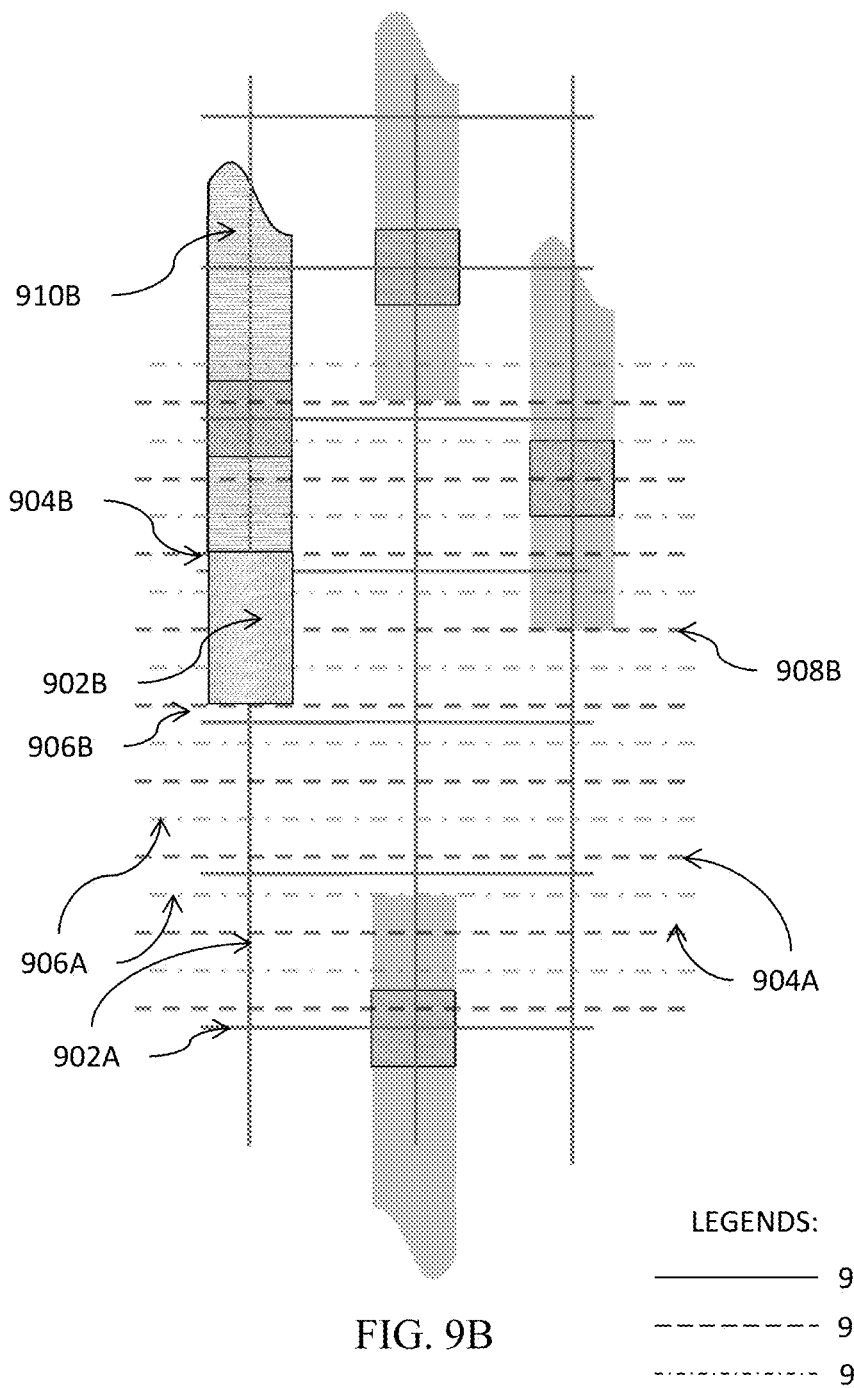
Figure 9C:
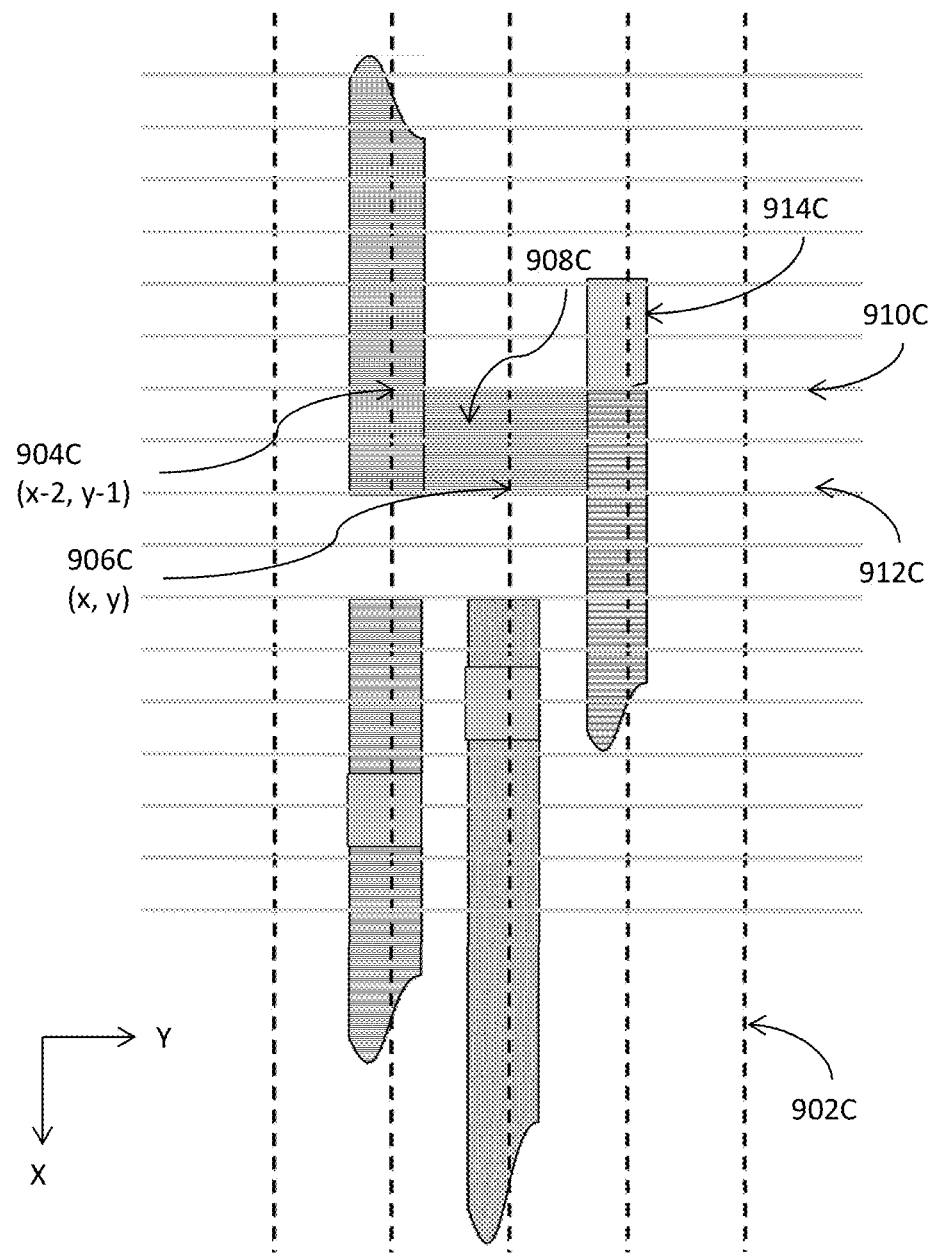

FIGS. 9A-C illustrate an exemplary implementation of the process illustrated in FIG. 4 in some embodiments. More specifically, FIG. 9A illustrates an working example of the processes described herein. In FIG. 9A, 902A denotes the routing tracks in the first direction and the second direction. 904A denotes the first set of grids (high grids) to which line ends running in the upward direction will be extended, and 906A denotes the second set of grids (low grids) to which line ends running in the downward direction will be extended. In this example, the direction of the low grids and the high grids is perpendicular to the routing direction of the routing tracks 902A.

Moreover, 912A denotes the shapes (e.g., interconnects, pins, terminals, pads, etc.) in the third routing layer (M3); 908A denotes shapes in the second routing layer (M2); and 910A denotes the shapes (e.g., interconnects) in the first routing layer (M1). The intersections between shapes of different routing layers represent vias. To further illustrate various processes and data described herein, it is further assumed that M1 has a routing pitch of 100-nm; M2 has a routing pitch of 100-nm; and M3 has a routing pitch of 150-nm. The minimum cut enclosure is assumed to be 40-nm, and the cut size is assumed to be 50-nm. Following the description of various embodiments described herein, the edge map for the second routing layer (M2) may be associated with or store the routing pitch of 100-nm, which corresponds to the routing pitch of M2.

The processes may determine the grid pitch for M2 to be 50-nm because 50-nm represents a common divisor (the great common divisor in this example) of the routing pitch 100-nm of M1 and the routing pitch 150-nm of M3. In some embodiments, the grid pitch may also be, for example, 25-nm or any common divisor of the two routing pitches of the two adjacent layers of M2. The processes described herein may also determine the grid offset to be half of the cut size (because the center of a via cut is placed along a routing track) plus the via enclosure rule (40-nm). In this example, the grid offset may be determined to be (50/2+40) or 65-nm. Therefore, the high grids may be offset from the routing tracks by 65-nm in the upward direction, and the low grids may be offset from the routing tracks by −65-nm, where the minus sign in the offset of the low grids indicates the offset is in the opposite direction of the high grids offset direction. In the example illustrated in FIG. 9A, no enforced extension is needed because all high_line_ends and low_line_ends fall on some grids.

FIG. 9B illustrates enforced extension of the low_line_end of a shape 910B (e.g., an interconnect) from the original position 904B to 906B with the enforced extension 902B representing an additional length added to the original shape 910B. In this example, various processes do not extend 910B to the closest low grid 908B but to the next closest grid 906B. This may be due to a violation of one or more design rules if the shape 910B were to be extended to 908B.

FIG. 9C illustrates an example of using an edge map to represent wrong-way interconnects. More specifically, assuming the preferred routing direction is the X-direction as shown by the routing tracks 902C. The shape (e.g., interconnect) 908C thus represents a wrong-way interconnect because 908C is appears to be routed in the Y-direction. In this example, some embodiments may employ extra bits of low_con and high_con to represent the wrong-way interconnect 908C. Also, grids may also be set up in such a way that the enforced extension (between 910C and 912C) is minimized for the wrong-way interconnect 912C.

As it can be seen in FIG. 9C, the coarser the grids are, the longer (in the X-direction) the wrong-way interconnect will be. Also, although wrong-way interconnect 908C appears to be routed in the Y-direction, various processes treat the wrong-way interconnect 908C as if it were a right-way interconnect and thus ensure that the line-ends of 908C are extended to the appropriate grids (910C and 912C) while using the low_con and high_con extra bits to indicate that 908C is a wrong-way interconnect. 904C denotes a through-wire at (x−2, y−1), and 906C denotes a line_end with both low_con and high_con at (x, y) to cover the span of the wrong-way interconnect. Moreover, 914C shows that right-way extension on wrong-way interconnect may also be accommodated by some embodiments.

System Architecture Overview

Figure 10:
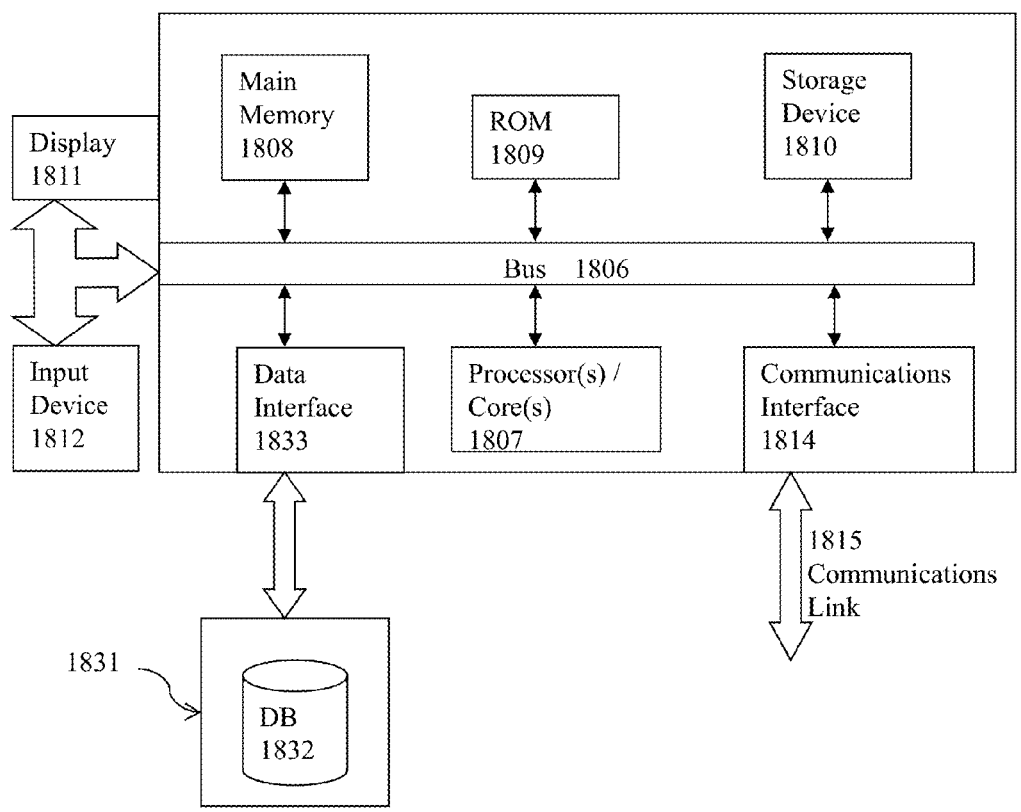
FIG. 10 illustrates a block diagram of an illustrative computing system 1400 suitable for implementing various embodiments described here.

FIG. 10 illustrates a block diagram of an illustrative computing system 1800 suitable for implementing various embodiment of the invention. For example, the exemplary computing system 1800 may be used to implement various processes as described in the preceding paragraphs and the figures such as various processes or modules of determining whether the first post is of interest, various analysis processes or modules, various other determining processes or modules, various processes or modules for performing various actions, etc. as described in the remainder of the Application. Computer system 1800 includes a bus 1806 or other communication mechanism for communicating information, which interconnects subsystems and devices, such as processor 1807, system memory 1808 (e.g., RAM), static storage device 1809 (e.g., ROM), disk drive 1810 (e.g., magnetic or optical), communication interface 1814 (e.g., modem or Ethernet card), display 1811 (e.g., CRT or LCD), input device 1812 (e.g., keyboard), and cursor control (not shown).

According to one embodiment of the invention, computer system 1800 performs specific operations by one or more processors or processor cores 1807 executing one or more sequences of one or more instructions contained in system memory 1808. Such instructions may be read into system memory 1808 from another computer readable/usable storage medium, such as static storage device 1809 or disk drive 1810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 1807 may be used to perform various actions such as various actions, processes, or modules involving determining, analyzing, performing actions, etc. In some embodiments, at least one of the one or more processors or processor cores 1807 has the multithreading capability.

In one embodiment, the term "logic" shall mean any combination of software or hardware that is used to implement all or part of the invention. In the single embodiment or in some embodiments, the one or more processors or processor cores 1807 may be used to perform various acts such as various acts involving determining, analyzing, performing actions, etc. In some embodiments, at least one of the one or more processors or processor cores 1807 has the multithreading capability to execute a plurality of threads to perform various tasks as described in the preceding sections.

Various actions as described in the preceding paragraphs may be performed by using one or more processors, one or more processor cores, or combination thereof 1807. For example, various processes or modules involving the determining action, various analysis processes or modules, etc. may be performed by one or more processors, one or more processor cores, or combination thereof.

The term "computer readable storage medium" or "computer usable storage medium" as used herein refers to any non-transitory medium that participates in providing instructions to processor 1807 for execution. Such a medium may take many forms, including but not limited to, non-volatile media and volatile media. Non-volatile media includes, for example, optical or magnetic disks, such as disk drive 1810. Volatile media includes dynamic memory, such as system memory 1808.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), a magnetic tape, any other magnetic or a magneto-optical medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the one or more master regions, one or more master output layers, one or more global scratch layers, various transforms and inverse transforms, shapes, etc.

In an embodiment of the invention, execution of the sequences of instructions to practice the invention is performed by a single computer system 1800. According to other embodiments of the invention, two or more computer systems 1800 coupled by communication link 1815 (e.g., LAN, PTSN, or wireless network) may perform the sequence of instructions required to practice the invention in coordination with one another.

Computer system 1800 may transmit and receive messages, data, and instructions, including program, i.e., application code, through communication link 1815 and communication interface 1814. Received program code may be executed by processor 1807 as it is received, and/or stored in disk drive 1810, or other non-volatile storage for later execution. In an embodiment, the computer system 1800 operates in conjunction with a data storage system 1831, e.g., a data storage system 1831 that contains a database 1832 that is readily accessible by the computer system 1800. The computer system 1800 communicates with the data storage system 1831 through a data interface 1836. A data interface 1836, which is coupled to the bus 1806, transmits and receives electrical, electromagnetic or optical signals that include data streams representing various types of signal information, e.g., instructions, messages and data. In embodiments of the invention, the functions of the data interface 1836 may be performed by the communication interface 1814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for implementing multiple-patterning-aware design rule check for an electronic design, comprising:
at least one processor of a computing system performing a process, the process comprising:
identifying a layout of an electronic design and a first set of multiple-exposure grids for at least a portion of a layer in the layout of the electronic design;
an edge map module coupled to the at least one processor identifying or creating a data structure that stores physical design data of a shape in the at least the portion of the layer based at least in part upon the first set of grids, wherein the physical design data for the shape in the data structure comprises location data of at least one shape end of the shape; and
performing design rule checking for the shape by using the data structure rather than the layout of the electronic design.

2. The computer implemented method of claim 1, in which the process further comprises at least one of:
converting a design rule into a grid-based design rule based at least in part upon the first set of multiple-exposure grids; and
performing enforced extension on at least one shape end of the shape.

3. The computer implemented method of claim 1, in which the physical data of the shape includes geometric data of the at least one shape end of the shape in the layer, and the design rule check is performed using the data structure in place of the layout of the electronic design.

4. The computer implemented method of claim 1, in which the design rule checking is performed for each of a plurality of shapes within a period of time that is independent of a total number of shapes to be checked in the layout.

5. The computer implemented method of claim 1, in which the act of identifying or creating the data structure to store the physical design data of the shape comprises:
identifying a format that corresponds to at least the first set of multiple-exposure grids for the data structure;
identifying the physical design data for one or more shape ends of the shape in the at least the portion of the layer; and
storing the physical design data of the one or more shape ends in the format for the data structure according to one or more locations of the shape ends.

6. The computer implemented method of claim 1, in which the physical design data in the data structure comprises absolute or relative coordinates of the at least one shape end with reference to the first set of grids.

7. The computer implemented method of claim 1, in which the act of performing the design rule checking for the shape comprises:
performing a constant time search to identify one or more other shapes according to a design rule.

8. The computer implemented method of claim 1, in which the process further comprises:
identifying a second set of multiple-exposure grids for at least the portion of a layer in the layout of the electronic design.

9. The computer implemented method of claim 1, in which the process further comprises:
  determining whether the at least one shape end of the shape is a high-end or a low-end;
  identifying or determining a grid for the at least one shape end from either the first set or from the second set of multiple-exposure grids; and
  performing the design rule checking for the shape based at least in part upon the grid.

10. The computer implemented method of claim 1, in which the act of performing the design rule checking for the shape comprises:
  identifying or determining a context or a halo for the shape based at least in part upon one or more design rules; and
  identifying one or more violations of the one or more design rules for the at least one shape end by using at least the context or the halo.

11. The computer implemented method of claim 1, in which the act of performing the design rule checking for the shape further comprises:
  performing a look-up process on the data structure to look up the one or more violations from the data structure.

12. The computer implemented method of claim 1, in which the one or more design rules include a directional design rule that applies to the electronic design according to a direction in which the shape is implemented in the layout.

13. The computer implemented method of claim 1, in which the process further comprises:
  fixing a violation associated with the shape based at least in part upon the first set of multiple-exposure grids.

14. The computer implemented method of claim 13, in which the process further comprises:
  identifying one or more fixing candidates by using at least in part upon the first set of multiple-exposure grids;
  modifying the shape by using at least a fixing candidate of the one or more fixing candidates; and
  determining whether the fixing candidate of the one or more fixing candidates resolves the violation.

15. The computer implemented method of claim 13, in which the process further comprises:
  determining effectiveness of the one or more fixing candidates;
  selecting a fixing candidate from the one or more fixing candidates; and
  modifying the shape by using at least a fixing candidate of the one or more fixing candidates.

16. The computer implemented method of claim 11, in which the design rule checking includes a constant time design checking process that is independent of a total number of shapes in the layout.

17. An article of manufacture comprising a non-transitory computer readable storage medium storing thereupon a sequence of instructions which, when executed by at least one processor or at least one processor core, causes the at least one processor or the at least one processor core to perform a method for implementing multiple-patterning-aware design rule check for an electronic design, the method comprising:
  identifying a layout of an electronic design and a first set of multiple-exposure grids for at least a portion of a layer in a layout of the electronic design;
  an edge map module including or functioning in conjunction with the at least one processor identifying or creating a data structure that stores physical design data of a shape in the at least the portion of the layer based at least in part upon the first set of grids, wherein the physical design data for the shape in the data structure comprises location data at least one shape end of the shape; and
  performing design rule checking for the shape by using the data structure rather than the layout of the electronic design.

18. The article of manufacture of claim 17, in which the process further comprises at least one of:
  converting a design rule into a grid-based design rule based at least in part upon the first set of multiple-exposure grids; and
  performing enforced extension on the at least one shape end of the shape.

19. The article of manufacture of claim 17, in which the act of identifying or creating the data structure to store the physical design data of the shape comprises:
  identifying a format that corresponds to at least the first set of multiple-exposure grids for the data structure;
  identifying the physical design data for one or more shape ends of the shape in the at least the portion of the layer; and
  storing the physical design data of the one or more shape ends in the format for the data structure according to one or more locations of the shape-ends.

20. The article of manufacture of claim 17, in which the process further comprises:
  identifying a second set of multiple-exposure grids for at least the portion of a layer in the layout of the electronic design;
  determining whether a shape end of the shape is a high-end or a low-end;
  identifying or determining a grid for the shape end from either the first set of multiple-exposure grids or from the second set of grids; and
  performing the design rule checking for the shape based at least in part upon the grid.

21. The article of manufacture of claim 17, in which the act of performing the design rule checking for the shape comprises:
  identifying or determining a context or a halo for the shape based at least in part upon one or more design rules;
  performing a constant time search to identify one or more other shapes by using at least the context or the halo; and
  identifying one or more violations of the one or more design rules for the shape end using the one or more other shapes.

22. The article of manufacture of claim 17, in which the act of performing the design rule checking for the shape further comprises:
  performing a look-up process on the data structure to look up the one or more violations from the data structure.

23. The article of manufacture of claim 17, in which the process further comprises:
  identifying one or more fixing candidates by using at least in part upon the first set of multiple-exposure grids;
  modifying the shape by using at least a fixing candidate of the one or more fixing candidates; and
  determining whether the fixing candidate of the one or more fixing candidates resolves the violation.

24. The article of manufacture of claim 23, in which the process further comprises:
  determining effectiveness of the one or more fixing candidates;
  selecting a fixing candidate from the one or more fixing candidates; and
  modifying the shape by using at least a fixing candidate of the one or more fixing candidates.

25. A system for implementing multiple-patterning-aware design rule check for an electronic design, comprising:
- non-transitory computer accessible storage medium storing thereupon computer code that includes a sequence of instructions;
- a data structure storing data of one or more electronic designs; and
- a computing system that comprises at least one processor having at least one processor core and execute the sequence of instructions to:
  - identify a layout of an electronic design and a first set of multiple-exposure grids for at least a portion of a layer in the layout of the electronic design; invoke an edge map module coupled to the at least one processor that identifies or creates the data structure that stores physical design data of a shape in the at least the portion of the layer based at least in part upon the first set of grids, wherein the physical design data for the shape in the data structure comprises location data of at least one shape end of the shape; and perform design rule checking for the shape by using the data structure rather than the layout of the electronic design.

26. The system of claim 25, in which the computing system is further to:
- convert a design rule into a grid-based design rule based at least in part upon the first set of multiple-exposure grids; or
- perform enforced extension on the at least one shape end of the shape.

27. The system of claim 25, in which the computing system that is to identify or create the data structure to store the physical design data of the shape is further to:
- identify a format that corresponds to at least the first set of multiple-exposure grids for the data structure;
- identify the physical design data for one or more shape ends of the shape in the at least the portion of the layer; and
- store the physical design data of the one or more shape ends in the format for the data structure according to one or more locations of the shape ends.

28. The system of claim 25, in which the computing system is further to
- identify a second set of multiple-exposure grids for at least the portion of a layer in the layout of the electronic design;
- determine whether a shape end of the shape is a high-end or a low-end;
- identify or determine a grid for the shape end from either the first set of multiple-exposure grids or from the second set of grids; and
- perform the design rule checking for the shape based at least in part upon the grid.

29. The system of claim 25, in which the computing system that is to perform the design rule checking for the shape is further to:
- identify or determine a context or a halo for the shape based at least in part upon one or more design rules;
- perform a constant time search to identify one or more other shapes by using at least the context or the halo; and
- identify one or more violations of the one or more design rules for the shape end using the one or more other shapes.

30. The system of claim 25, in which the computing system that is to perform the design rule checking for the shape is further to:
- perform a look-up process on the data structure to look up the one or more violations from the data structure.

31. The system of claim 25, in which the computing system is further to
- identify one or more fixing candidates by using at least in part upon the first set of multiple-exposure grids;
- modify the shape by using at least a fixing candidate of the one or more fixing candidates; and
- determine whether the fixing candidate of the one or more fixing candidates resolves the violation.

32. The system of claim 31, in which the computing system is further to
- determine effectiveness of the one or more fixing candidates;
- select a fixing candidate from the one or more fixing candidates; and
- modify the shape by using at least a fixing candidate of the one or more fixing candidates.

* * * * *